US011869562B1

(12) United States Patent
Wilkerson et al.

(10) Patent No.: US 11,869,562 B1
(45) Date of Patent: *Jan. 9, 2024

(54) APPARATUS AND METHOD FOR ENDURANCE OF NON-VOLATILE MEMORY BANKS VIA WEAR LEVELING IN A ROUND ROBIN FASHION

(71) Applicant: Kepler Computing Inc., San Francisco, CA (US)

(72) Inventors: Christopher B. Wilkerson, Portland, OR (US); Sasikanth Manipatruni, Portland, OR (US); Rajeev Kumar Dokania, Beaverton, OR (US); Amrita Mathuriya, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 198 days.

This patent is subject to a terminal disclaimer.

(21) Appl. No.: 17/357,876

(22) Filed: Jun. 24, 2021

Related U.S. Application Data

(63) Continuation of application No. 17/339,854, filed on Jun. 4, 2021.

(51) Int. Cl.
*G11C 11/22* (2006.01)
*G06F 12/02* (2006.01)
(Continued)

(52) U.S. Cl.
CPC ........ *G11C 11/221* (2013.01); *G06F 12/0246* (2013.01); *G11C 11/02* (2013.01);
(Continued)

(58) Field of Classification Search
CPC . G11C 11/221; G11C 11/225; G11C 13/0035; G06F 12/0246; G06F 2212/7202; G06F 2212/7211
See application file for complete search history.

(56) References Cited

U.S. PATENT DOCUMENTS 11,295,796 B1 * 4/2022 Wilkerson ........... G11C 16/105
11,670,352 B1 * 6/2023 Wilkerson ........... G11C 16/105
711/104

(Continued)

OTHER PUBLICATIONS

Notice of Allowance dated Feb. 1, 2022 for U.S. Appl. No. 17/344,817.

(Continued)

*Primary Examiner* — Jay W. Radke
(74) *Attorney, Agent, or Firm* — MUGHAL GAUDRY & FRANKLIN PC

(57) ABSTRACT

Endurance mechanisms are introduced for memories such as non-volatile memories for broad usage including caches, last-level cache(s), embedded memory, embedded cache, scratchpads, main memory, and storage devices. Here, non-volatile memories (NVMs) include magnetic random-access memory (MRAM), resistive RAM (ReRAM), ferroelectric RAM (FeRAM), phase-change memory (PCM), etc. In some cases, features of endurance mechanisms (e.g., randomizing mechanisms) are applicable to volatile memories such as static random-access memory (SRAM), and dynamic random-access memory (DRAM). The endurance mechanisms include a wear leveling scheme that uses index rotation, outlier compensation to handle weak bits, and random swap injection to mitigate wear out attacks.

18 Claims, 18 Drawing Sheets

(51) Int. Cl.
*G11C 11/02* (2006.01)
*G11C 13/00* (2006.01)
(52) U.S. Cl.
CPC ........ *G11C 11/225* (2013.01); *G11C 13/0002* (2013.01); *G11C 13/0021* (2013.01); *G06F 2212/7211* (2013.01)

(56) References Cited

U.S. PATENT DOCUMENTS

| | | |
|---|---|---|
| 2002/0032879 A1* | 3/2002 | Sun ................. G06F 11/1417 714/E11.135 |
| 2006/0106972 A1 | 5/2006 | Gorobets et al. |
| 2018/0285015 A1 | 10/2018 | Ruan et al. |
| 2019/0042109 A1* | 2/2019 | Fackenthal ......... G11C 11/2253 |
| 2020/0098415 A1* | 3/2020 | Liu ........................ H10B 53/30 |
| 2020/0105354 A1 | 4/2020 | Helmick et al. |

OTHER PUBLICATIONS

Qureshi, M., et al. "Enhancing lifetime and security of PCM-based main memory with start-gap wear leveling." 2009 42nd Annual IEEE/ACM international symposium on microarchitecture (MICRO). IEEE, 2009.

Wilkerson, C., "Reducing cache power with low-cost, multi-bit error-correcting codes". In Proceedings of the 37th annual international symposium on Computer architecture (ISCA '10).

Wilkerson, C., "Trading off Cache Capacity for Reliability to Enable Low Voltage Operation". In Proceedings of the 35th Annual International Symposium on Computer Architecture (ISCA 2008).

* cited by examiner

300

Mapping an index to an index rotated cache

```
Int map_index(int index) { //returns new index
    int new_index = (start_ptr + index) & max_Vindex;
    if (new_index >= gap_ptr){
        new_index++
    }
    return new_index;
}
```

Fig. 3

Rotating the index, incrementing the gap pointer and start pointer

400

```
Void inc_gap_ptr(int *swap_ptr1, int *swap_ptr2){
    if (gap_ptr == 0){
        start_ptr = (start_ptr + 1) & max_Vindex;
        (*swap_ptr1) = 0;
        (*swap_ptr2) = max_Pindex;
        gap_ptr = nax_Pindex;
    }
    else{
        (*swap_ptr1) = gap_ptr;
        (*swap_ptr2) = gap_ptr – 1;
        gap_ptr = gap_ptr – 1;
    }
}
```

```
Void inc_gap_ptr(int *swap_ptr1, int *swap_ptr2){
    if (random_generator( ) < threshold){   //e.g., threshold of 0.5
        //perform swap
        if (gap_ptr == 0){
            start_ptr = (start_ptr + 1) & max_Vindex;
            (*swap_ptr1) = 0;
            (*swap_ptr2) = max_Pindex;
            gap_ptr = nax_Pindex;
        }
        else{
            (*swap_ptr1) = gap_ptr;
            (*swap_ptr2) = gap_ptr – 1;
            gap_ptr = gap_ptr – 1;
        }
    }
    else{
        //skip swap
    }
}
```

Fig. 7

APPARATUS AND METHOD FOR ENDURANCE OF NON-VOLATILE MEMORY BANKS VIA WEAR LEVELING IN A ROUND ROBIN FASHION

CLAIM FOR PRIORITY

This application is a continuation of, and claims the benefit of priority to U.S. patent application Ser. No. 17/339,854, filed on Jun. 4, 2021, titled "APPARATUS AND METHOD FOR ENDURANCE OF NON-VOLATILE MEMORY BANKS VIA WEAR LEVELING WITH LINEAR INDEXING," and which is incorporated by reference in entirety.

BACKGROUND

Static random-access memory (SRAM) and dynamic random-access memory (DRAM) have high endurance. Conversely, memory technologies such as ferroelectric based memories, magnetic random-access memories, and three-dimensional cross-point memory have limited endurance. Due to limited endurance, products that use these memory technologies use wear leveling schemes such as flash translation layer for flash memories. Flash translation layer has high overheard and such techniques are not suitable for ferroelectric based memories.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 3 illustrates a pseudocode for mapping an index to an index rotated cache, in accordance with some embodiments.

FIG. 4 illustrates a pseudocode for rotating the index, incrementing the gap pointer and start pointer, in accordance with some embodiments.

FIG. 7 illustrates a pseudo-code for random swap injection, in accordance with some embodiments.

DETAILED DESCRIPTION

Figure 1A:
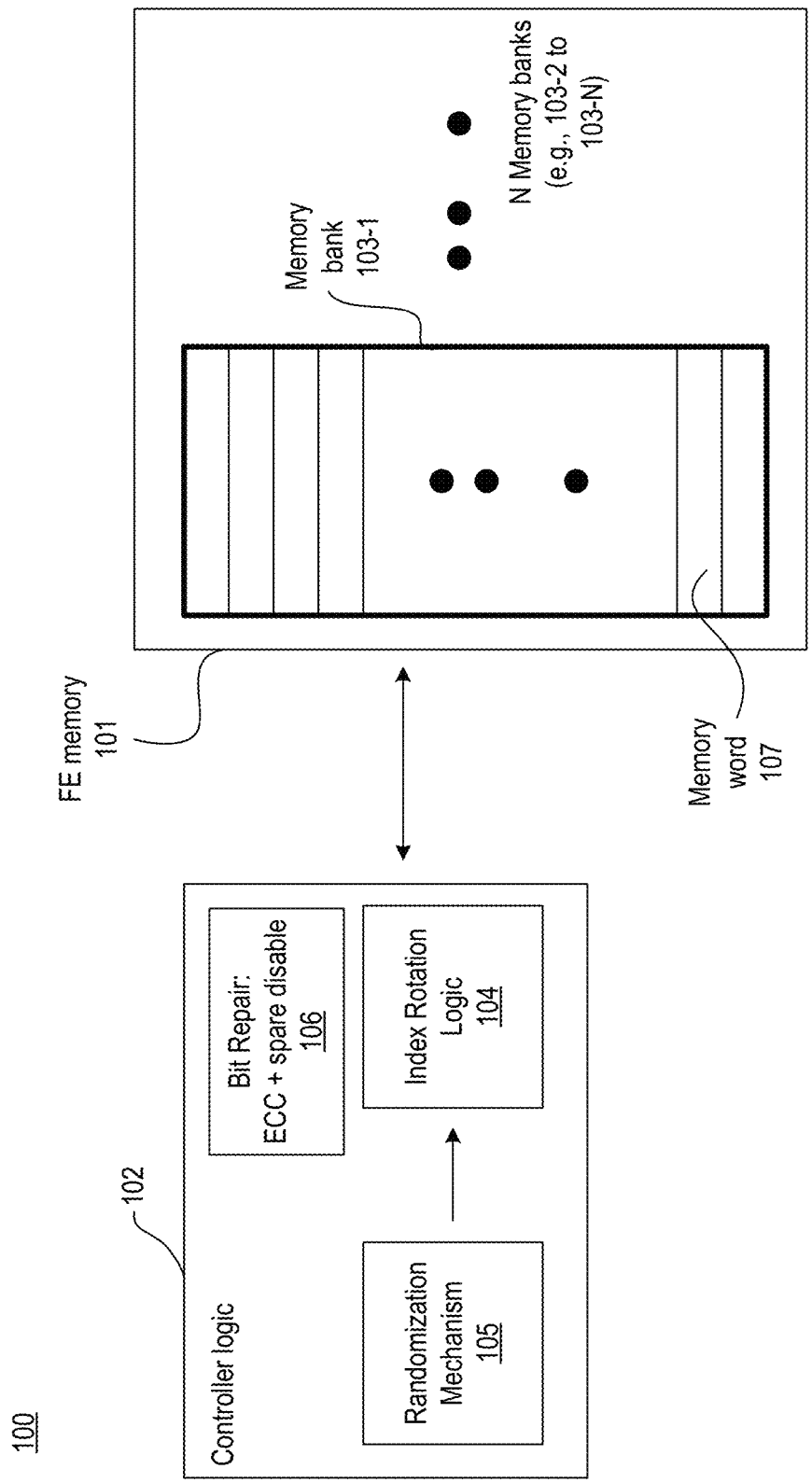
FIG. 1A illustrates a high-level endurance enhancement architecture for ferroelectric memory banks, in accordance with some embodiments.

Some embodiments describe endurance mechanisms for memories such as non-volatile memories for broad usage including caches, last-level cache(s), embedded memory, embedded cache, scratchpads, main memory, and storage devices. Here, non-volatile memories (NVMs) include magnetic random-access memory (MRAM), resistive RAM (ReRAM), ferroelectric RAM (FeRAM), phase-change memory (PCM), etc. In some embodiments, non-volatile memories may have non-volatile material that still need a refresh action as contents may be disturbed over time. For example, FeRAM may apply a refresh scheme to make sure the contents in its capacitor remain valid. The refresh may be applied periodically or on a need-by-need basis. For instance, refresh may be applied every 1 second, or applied when a sensor determines that the contents on a storage node have been disturbed. While various embodiments are described with reference to FeRAM, the embodiments are applicable to other NVMs such as those listed here. In some embodiments, the NVM is integrated on a die which includes compute logic. In some embodiments, NVM is on a separate die which is packaged in a single package with a compute die. In some embodiments, the NVM is on a different package than the compute die. Here, examples of compute die include a die that is used for computations such as an inference logic, graphics processing unit, central processing unit, application specific integrated circuit (ASIC), digital signal processor, etc. In some embodiments, features of endurance mechanisms (e.g., randomizing mechanisms) are applicable to volatile memories such as static random-access memory (SRAM), and dynamic random-access memory (DRAM).

The endurance mechanisms of some embodiments include a wear leveling scheme that uses index rotation, outlier compensation to handle weak bits, and random swap injection (which is an example of a randomizing mechanism) to mitigate wear out attacks. In some embodiments, index rotation logic is provided, which rotates the addresses throughout a memory bank to perform a wear leveling function. Index rotation logic ensures that memory requests are spread across memory locations rather than a single memory location. In some embodiments, randomizing mechanism is used to randomize a mapping of an incoming address to an intermediate index. One example, of a randomizing mechanism includes a random invertible bit matrix. This intermediate index is used by an index rotation logic to map to an actual physical index. In some embodiments, the rotation of gap words in the memory bank is randomized. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult. In some embodiments, random invertible bit matrix enables random swap injection which randomizes index rotation to obfuscate the mapping from addresses to rotated indexes. In some embodiments, bit repair logic is provided, which includes double error correcting, or triple error detecting error correction code (ECC) to discover new bit errors and spare disable which eliminates memory words with particularly high error rates.

There are many technical effects of the various embodiments. For example, memory endurance for ferroelectric memory is enhanced by the endurance mechanisms of various embodiments. This allows more read and writes to memory before any memory block, bank, or word becomes unreliable. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top." "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "front end" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates a high-level endurance enhancement architecture 100 for ferroelectric memory banks, in accordance with some embodiments. Architecture 100 comprises memory 101 and controller logic 102. In various embodiments, memory 101 is memory with non-linear polar material. For example, memory 101 includes bit-cells that comprise at least one transistor and at least one capacitor coupled to it, where the capacitor has non-linear polar material. Examples of non-linear material include ferroelectric (FE) material, paraelectric (PE) material, and non-linear dielectric material.

In various embodiments, FE material can be any suitable low voltage FE material that allows the FE material to switch its state by a low voltage (e.g., 100 mV). Threshold in FE material has a highly non-linear transfer function in the polarization vs. voltage response. The threshold is related to a) non-linearity of switching transfer function, and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in $PbTiO_3$ a P-E (polarization-electric field) square loop can be modified by La or Nb substitution to create an S-shaped loop. The shape can be systematically tuned to ultimately yield a non-linear dielectric. The squareness of the FE switching can also be changed by the granularity of an FE layer. A perfectly epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched $SrRuO_3$ bottom electrode yielding P-E loops that are square. Progressive doping with La will reduce the squareness.

In some embodiments, FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides).

In some embodiments, FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted $BiFeO_3$, $BrCrO_3$, $BuCoO_3$ class of materials, La or rate earth substitution into the Bi site can tune the spontaneous distortion. In some embodiments, FE material is contacted with a conductive metal oxide that includes one of the conducting perovskite metallic oxides exemplified by: La—Sr—$CoO3$, $SrRuO3$, La—Sr—$MnO3$, $YBa2Cu3O7$, $Bi2Sr2CaCu2O8$, and $LaNiO3$.

In some embodiments, FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements, especially Sc, Ti, V, Cr, Mn, Fe, Co, Ni, Cu, Zn. A' may have the same valency of site A, with a different ferroelectric polarizability. In various embodiments, when metallic perovskite is used for FE material, conductive oxides can include one or more of: $IrO_2$, $RuO_2$, $PdO_2$, $OsO_2$, or $ReO_3$. In some embodiments, the perovskite is doped with La or Lanthanides. In some embodiments, thin layer (e.g., approximately 10 nm) perovskite template conductors such as $SrRuO_3$ coated on top of IrO2, RuO2, PdO2, PtO2, which have a non-perovskite structure but higher conductivity to provide a seed or template for the growth of pure perovskite ferroelectric at low temperatures, are used as conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, FE material comprises one or more of: Hafnium (Hf), Zirconium (Zr), Aluminum (Al), Silicon (Si), their oxides or their alloyed oxides. In some embodiments, FE material includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, FE material includes Bismuth ferrite (BFO), BFO with a doping material where in the doping material is one of Lanthanum, or any element from the lanthanide series of the periodic table. In some embodiments, FE material includes lead zirconium titanate (PZT), or PZT with a doping material, wherein the doping material is one of La, Nb. In some embodiments, FE material includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, FE material includes Hafnium oxides of the form, Hf1−x Ex Oy where E can be Al, Ca, Ce, Dy, er, Gd, Ge, La, Sc, Si, Sr, Sn, or Y. In some embodiments, FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, FE material comprises organic material. For example, Polyvinylidene fluoride or polyvinylidene difluoride (PVDF).

In some embodiments, FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when FE material comprises hexagonal ferroelectrics, the conductive oxides are of A2O3 (e.g., In2O3, Fe2O3) and ABO3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

While various embodiments here are described with reference to ferroelectric material for storing the charge state, the embodiments are also applicable for paraelectric material. For example, non-linear paraelectric material of various embodiments can be formed using paraelectric material instead of ferroelectric material. In some embodiments, paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

In some embodiments, FE memory 101 includes a plurality of memory banks (e.g., 103-1 through 103-N, where 'N' is a number). Each memory bank (e.g., 103-1) includes a plurality of memory words (e.g., memory word 107). Each memory word includes a plurality of memory bit-cells. For simplicity sake, other memory components are not shown such as write drivers, column multiplexers, sense-amplifiers, etc.

In various embodiments, controller logic 102 comprises endurance hardware and/or software to provide memory endurance to memory 101. In general, memory endurance is needed to ensure write and/or read operations from memory 101 are reliable. Write endurance is a number of program and erase cycles that applied to a memory block, bank, or word before the memory block, bank, or word becomes unreliable. The endurance mechanisms of some embodiments include a wear leveling scheme that uses index rotation, outlier compensation to handle weak bits, and random swap injection to mitigate wear out attacks. For sake of simplicity, memory banks are generally referred by their reference 103 instead of a particular memory bank reference (e.g., 103-1, 103-2, etc.). Embodiments described to the general reference are applicable to all particular references. For example, description for memory bank 103 is applicable to memory banks 103-1, 103-2, through 103-N.

In some embodiments, controller logic 102 comprises index rotation logic 104 for implementing the wear leveling scheme. In some embodiments, index rotation logic 104 rotates the addresses throughout memory bank 103 to perform a wear leveling function. In various embodiments, index rotation logic 104 ensures that memory requests are spread across memory locations rather than a single memory location.

In some embodiments, controller logic 102 includes random invertible bit matrix 105 which is used to randomize the rotation of gap words in memory bank 103. In some cases, malicious users (or attackers) may write programs that deliberately track the wear leveling scheme described herein. These attackers may attempt to alter a memory reference pattern to continue to stress a single physical line even as the wear leveling scheme assigns that physical line to different addresses. Some embodiments provide a facility to make tracking of the physical lines difficult. This facility makes a random decision (e.g., using an externally generated random number) to either swap or not each time a swap opportunity arises. Over time the randomness injected into the swapping process makes tracking cache lines more difficult. In some embodiments, random invertible bit matrix 105 enables random swap injection which randomizes index rotation to obfuscate the mapping from addresses to rotated indexes.

In some embodiments, bit repair logic 106 includes double error correcting, or triple error detecting error correction code (ECC) to discover new bit errors and spare disable which eliminates memory words with particularly high error rates. Spare disable involves having a buffer of spare cache lines. When cache lines are particularly unreliable, spare disable can swap out unreliable cache lines for the reliable spares. In some embodiments, the spares may be implemented with a memory technology other than FE memory such as static random-access memory (SRAM). In various embodiments, bit repair logic 106 addresses the problem of weak memory bits. In some embodiments, each cache line or word 107 in memory bank 103 includes a valid bit. The valid bit indicates whether the data associated with that line/word is stored in the memory or a redundant word array. The redundant word array comprises spares that can be used to compensate for defective words in memory. When accessing memory, controller 102 checks the valid bit, if the valid bit is set then the data is stored in the redundant memory rather than the memory array or bank 103. In various embodiments, ECC is used to identify and/or correct bit errors in both the memory array and the redundant memory. As the ECC discovers bit errors, additional lines may be marked valid and the data stored in the redundant memory location rather than the memory. The various endurance mechanisms discussed herein can be used in any combination or order. Some memory products may select one or more of the endurance mechanisms instead of all three discussed herein. Some memory products may apply all three endurance mechanisms to achieve most endurance for FE memory 101. These endurance mechanisms are applied to FE memory 101 to maximize usage of such memory.

Figure 1B:
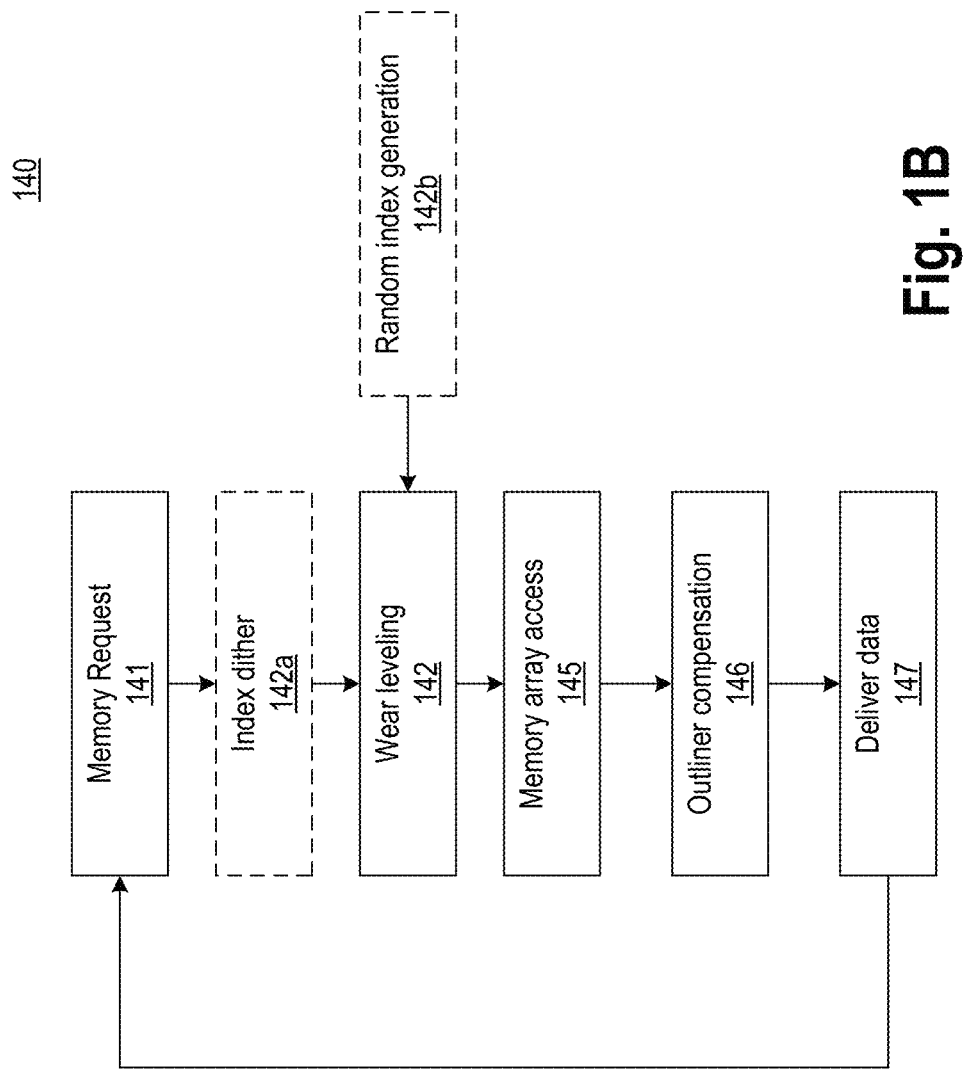
FIG. 1B illustrates a flowchart of memory endurance for ferroelectric memory banks, in accordance with some embodiments.

FIG. 1B illustrates flowchart 140 of memory endurance for ferroelectric memory banks, in accordance with some embodiments. While the blocks in flowchart 140 are illustrated in a particular order, the order can be modified. For example, some blocks may be performed before others based on whether read or write operations are being performed. As described herein, the various blocks can be implemented in hardware, software, or a combination of them.

At block 141, controller 102 sends a memory request to memory 101. This request is may be a read request or a write request. If it's a write request, controller 102 applies the wear leveling scheme at block 142. In some embodiments, the wear leveling scheme is linear in that a gap word or gap cache line is swapped with an adjacent word or cache line. In some embodiments, wear leveling is dithered as indicated by block 142a. In one such embodiment, the index or pointer to gap word or gap cache line is used to swap the gap word or gap cache line with either an adjacent cell with one higher index or address or with an adjacent cell with one lower index or address. As such, wear leveling is dithered.

In some embodiments, wear leveling is randomized. In one such embodiment, a random index is generated at block 142b. This random index is then used to swap the gap word or gap cache line with an adjacent or a non-adjacent word or cache line. In some embodiments, the random index is dithered. This dithered random index is then used for wear leveling.

In some embodiments, if the memory request is a read access (as indicated by block 145), outlier compensation is applied as indicated by block 146. At block 146, controller 102 addresses the problem of weak memory bits by checking a valid bit for the memory word being addressed or accessed. The valid bit indicates whether the data associated with that line or word is stored in the memory or the redundant word array. The redundant word array comprises spares that can be used to compensate for defective words in memory. When accessing memory, controller 102 checks the valid bit, if the valid bit is set then the data is stored in the redundant memory rather than the memory array or bank 103. In various embodiments, ECC is used to identify and/or correct bit errors in both the memory array and the redundant memory. As the ECC discovers bit errors, additional lines may be marked valid and the data stored in the redundant memory location rather than the memory. After ECC is applied, the requested data is provided to controller 102.

Figure 2A:
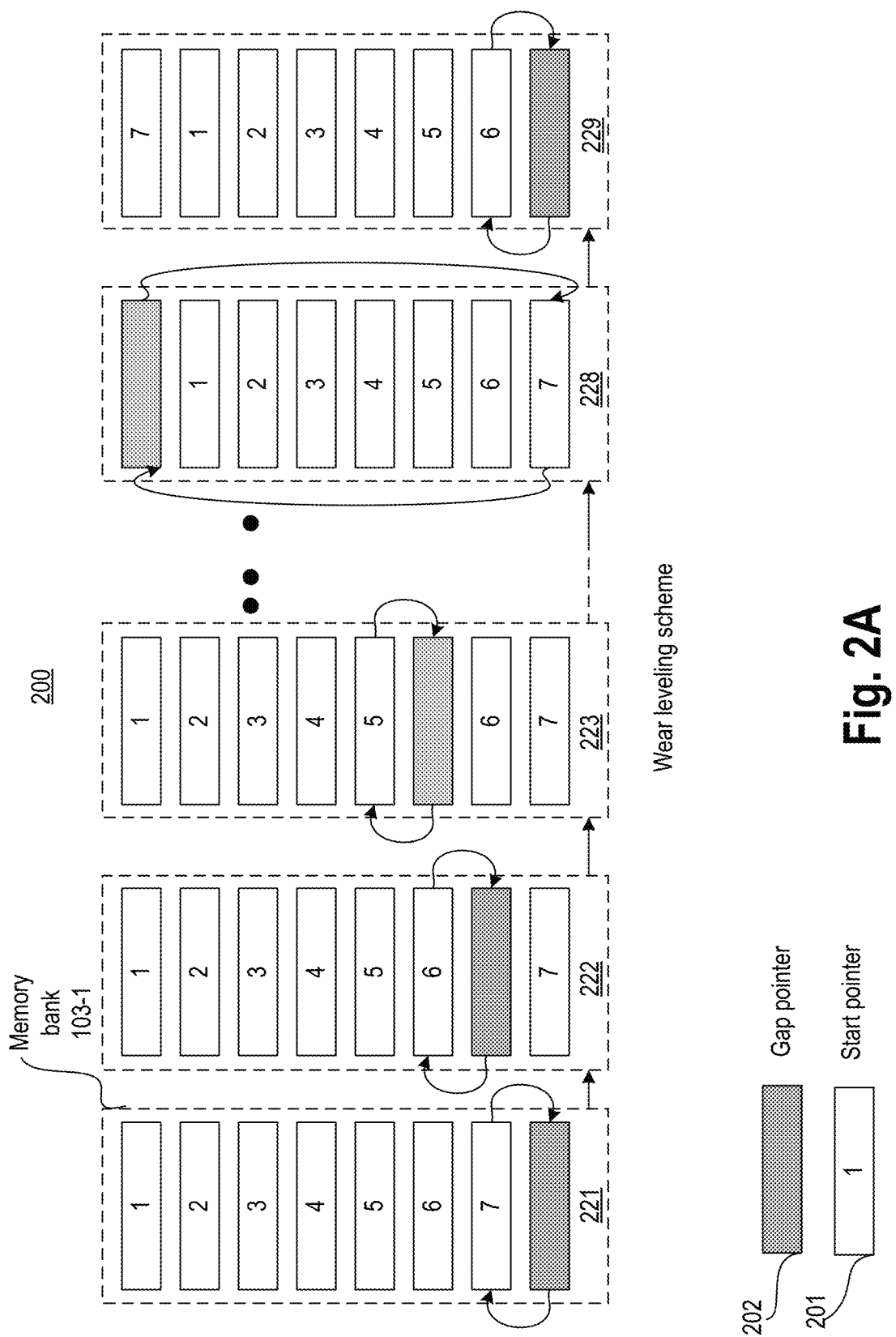
FIG. 2A illustrates a wear leveling scheme for a ferroelectric memory bank, in accordance with some embodiments.

FIG. 2A illustrates wear leveling scheme 200 (e.g., 104) for a ferroelectric memory bank, in accordance with some embodiments. The scheme is illustrated for one memory bank 103-1. Each memory bank 103 includes a start pointer 201 and a gap pointer 202, in accordance with some embodiments. In this example, there are seven words or cache-lines 107 in memory bank 103. An additional address for a word is reserved for a gap word having a gap pointer associated with it. The various snapshots (221, 222, 223, 228, 229) of memory bank 103-1 illustrate the rotation of gap pointer 202 relative to start pointer 201. In various embodiments, start pointer 201 and gap pointer 202 are stored in registers. In various embodiments, gap pointer 202 points to an empty space in a memory bank, and this empty space is used for completing the swapping process where a word or cache-line is swapped with another word or cache-line.

The basic principle here is to ensure that memory requests are spread across memory locations rather than a single memory location. Conceptually, a memory with 1024 words with wear leveling will exhibit 1024x the worst-case endurance of the same memory without wear leveling. The worst-case behavior being a repeated access to a single word. In various embodiments, a gap word (shaded word) is shifted through memory bank 103, swapped with an adjacent memory location or word once per interval of time. After each swap, a single memory location has moved to the adjacent memory location. In snapshot 221, the gap word is swapped with adjacent word number 7. In snapshot 222, the gap word is swapped with adjacent word number 6. In snapshot 223, the gap word is swapped with adjacent word number 5. In snapshot 228, the gap word is swapped with next adjacent word number 7, as the cycle of swapping restarts. In snapshot 229, the gap word is swapped with the next adjacent word number 6. Note, snap shots 221, 222, and 223 as shown have a start pointer of value 0 while snap shots 228 and 229 as shown have a start pointer of value 1.

A memory with N memory words will undergo a complete sweep (all memory locations moved to the adjacent location) after N swaps. The term "swap" here generally refers to an interval in time that indicates the time between exchanging a single cache line with a gap cache line. Swaps will occur once during a time interval, every T cache referenced, for example. After N sweeps all memory locations will have been shifted throughout the cache and back to their original position. The term "sweep" here generally refers to an interval in time that indicates time to move all cache lines over by 1. After N sweeps, a rotation is complete. The term "rotate" here generally refers to an interval in time which indicates a time to move each cache line through each physical location in the cache and return each cache line to its original position. The number of cache references between sweeps will be N*T. For example, the number of references between sweep is equal to a number of words (or cache lines) times the swap interval. The number of cache references between rotations will be N*N*T. For example, the number of references between rotates is equal to the number of references between sweeps times the number of words.

Figure 2B:
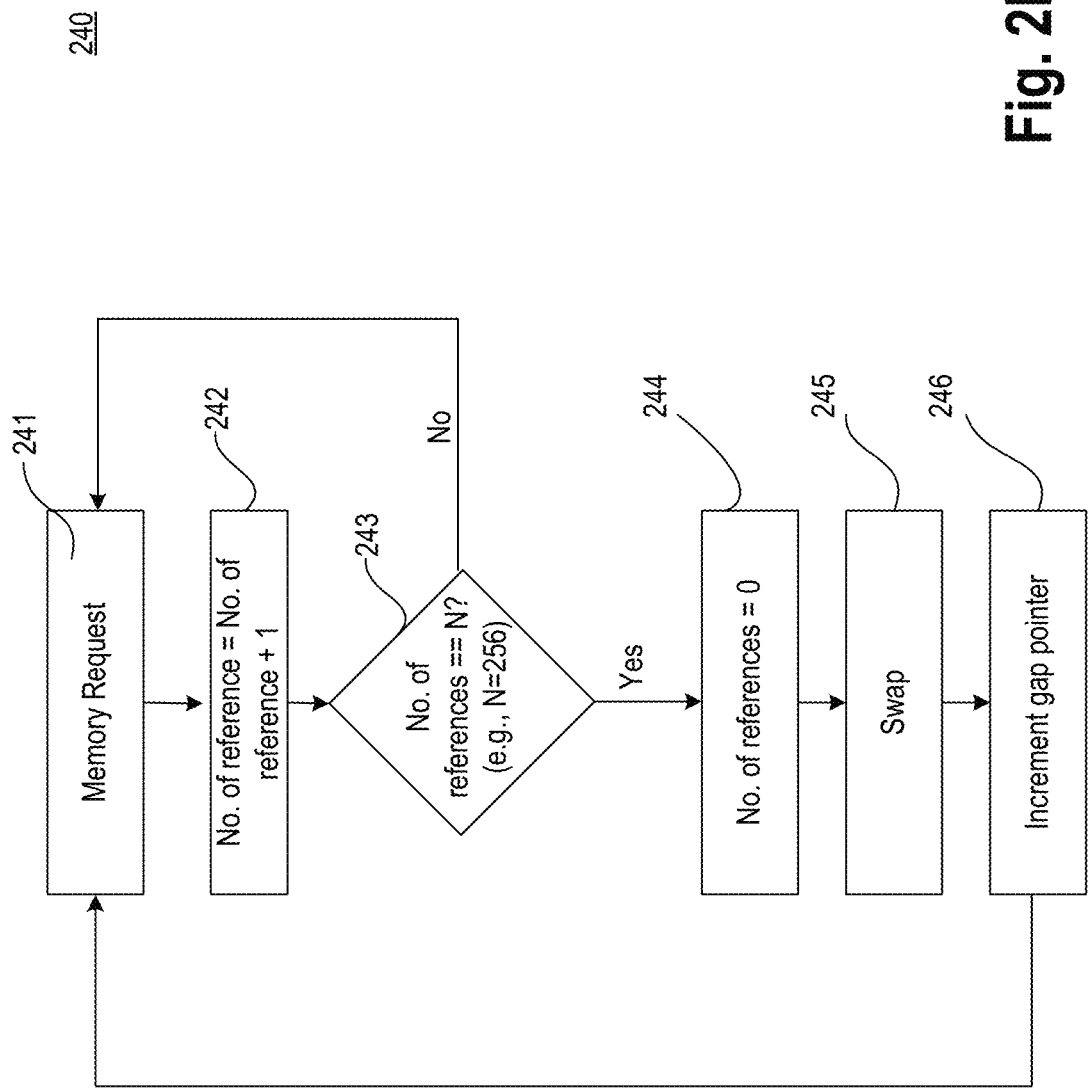
FIG. 2B illustrates a flowchart of memory endurance using wear leveling, in accordance with some embodiments.

FIG. 2B illustrates flowchart 200 of memory endurance using wear leveling, in accordance with some embodiments. In some embodiments, at block 241, upon receiving a memory write access, controller 102 performs wear leveling. At block 242, the number of references (both write or read references) are counted and incremented by one. In some embodiments, a counter (e.g., a hardware or software counter) counts the number of references across memory bank 103 or cache. At block 243, a determination is made whether the number of references is equal to 'N', where 'N' may represent number of words or cache-lines in memory bank 103. If the number of references is not equal to N (e.g., number of references is less than N) then the process proceeds to block 241 where the next memory bank reference increments the number of references. Once the number of references becomes equal to N (e.g., a threshold of 256), the counter that tracks the number of references is reset. As such, at block 244, the number of references is set to zero. The next time the number of references is set to zero is when the counter counts to N again. At block 245, gap word is swapped with an adjacent word or cache line, and data is written to the swapped word. As such, writing to memory bank 103 is performed in different words instead of the same word because after each swap, a single memory location has moved to the adjacent memory location. At block 246, the gap pointer is incremented to allow the next write to memory bank 103 to be done on another swapped memory word.

While the embodiments are illustrated with respect to incrementing the number of references using an up-counter, flowchart 200 can be modified to start the number of reference count at N and decrementing it down to zero and then presetting number of references to N once the number of references reaches zero.

FIG. 3 illustrates pseudocode 300 for mapping an index to an index rotated cache, in accordance with some embodiments. Pseudocode 300 shows how the gap pointer 202 is updated. FIG. 4 illustrates pseudocode 400 for rotating the index, incrementing the gap pointer and start pointer, in accordance with some embodiments. Pseudocode 400 shows computation of a new index reflective of start pointer 201 and gap pointer 202 give a current memory address index. In various embodiments, pseudocodes 300 and 400 are implemented in a hardware description language (HDL) which is synthesized in hardware form as part of controller 102. In some embodiments, the hardware can be controlled by firmware or software. For example, gap pointer 202 can be randomized using a random number generator which may be a software (or hardware or a combination of them).

Figure 5A:
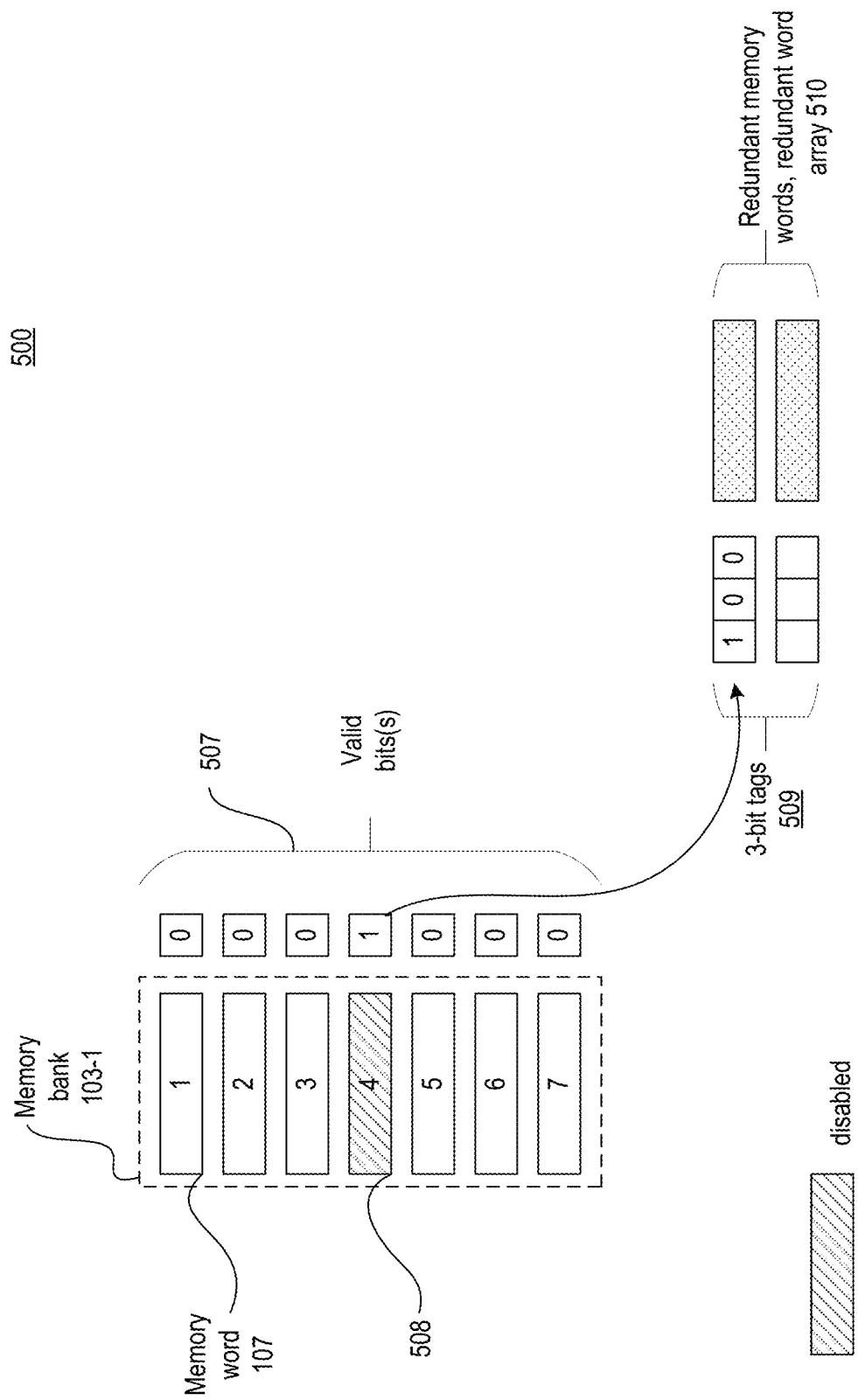
FIG. 5A illustrates an outlier compensation scheme for a ferroelectric memory bank, in accordance with some embodiments.

FIG. 5A illustrates outlier compensation scheme 500 (e.g., 106) for a ferroelectric memory bank, in accordance with some embodiments. In various embodiments, outlier compensation scheme 500 addresses the issue of weak memory bits in memory bank 103. In various embodiments, each cache line or word 107 in memory bank 103 includes a valid bit. For memory bank 103, valid bits are shown as bits 507. In this example, cache line or word 508 has a valid bit set to 1 while other cache lines or words have their valid bits set to 0. The word with valid bit set to 1 is marked as disabled because its data is invalid. The valid bit indicates whether the data associated with that cache line or word 107 is stored in the memory or a redundant word array. Each valid bit has an associated tag (or tags) 509 that correspond to redundant memory word array 510. The example here shows a 3-bit tag. However, the embodiments are not limited to a 3-bit tag. Any number of bits may be used for the tag. Redundant word array 510 comprises spares that can be used to compensate for defective words in memory bank 103. In some embodiments, redundant word array 510 takes a small memory area compared to entire memory 101. For example, spare buffers in redundant word array 510 that contain spare data or copies of data (or redundant data) use about 1% of the total memory array. In one instance, for highly associating memory of 4 MB cache with 64K cache lines will have about 320 spares and will be associative. Here it is assumed that the valid bit is set (e.g., to logic value 1) to indicate that the valid data can be found in the redundant word array rather than primary memory bank 103.

When accessing memory 101, controller 102 checks the valid bits 507. In various embodiments, all memory accesses go through the primary memory array (e.g., memory banks 103). If any of the valid is set then the data is stored in redundant memory array 510 rather than memory bank 103. A valid bit set to 1 indicates that the corresponding cache line or word 107 (here, 508) is disabled. As such, a second lookup is performed in a redundant array 510 to look for the data. In some embodiments, the requested address is looked up in redundant memory array 510 and compared against tags 509 contained in redundant memory array 510. The matching tag indicates the redundant memory location that holds the data which is to be retrieved. The data is then provided from the redundant memory location in response to the memory access by controller 102.

In some embodiments, an ECC is used to identify and/or correct bit errors in both the memory array and the redundant memory. As the ECC code discovers bit errors, additional cache lines 107 may be marked valid and the data is stored in the redundant memory location (e.g., array 510) rather than memory banks 103. These lines may be marked so that they can be reintroduced into memory 103 at different times to discover if they are transient or permanent bit errors. In some embodiments, redundant array 510 is of a different memory technology than the primary memory (e.g., memory banks 103). For example, redundant array 510 comprises static random-access memory (SRAM) while memory banks 103 comprise ferroelectric or paraelectric memory. In some embodiments, the valid bits 507 are also of a different memory technology than the primary memory (e.g., memory banks 103). For example, the valid bits are stored in an SRAM.

Figure 5B:
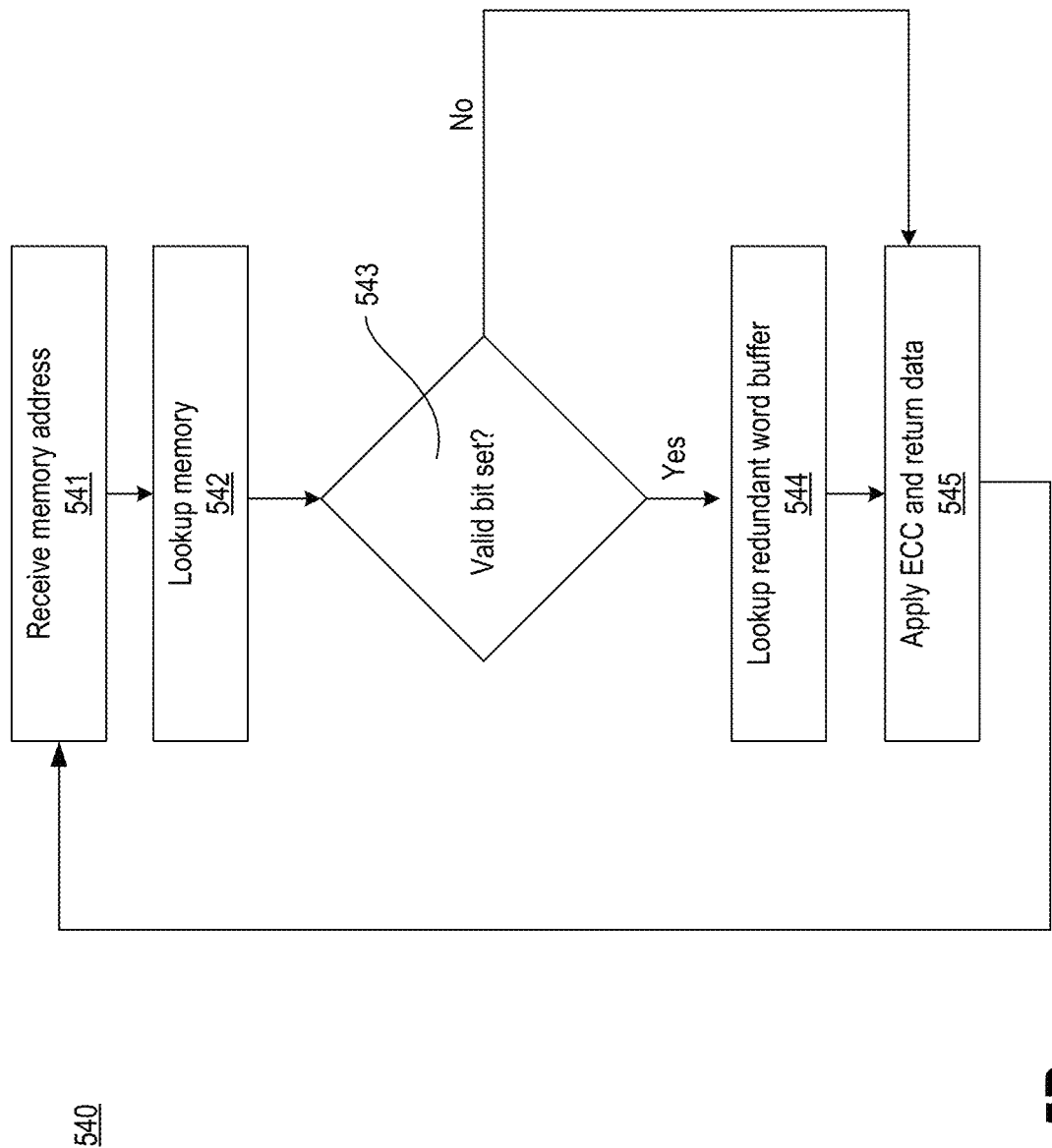
FIG. 5B illustrates a flowchart of memory endurance using outlier compensation, in accordance with some embodiments.

FIG. 5B illustrates flowchart 540 of memory endurance using outlier compensation, in accordance with some embodiments. The various blocks of the flowchart may be performed by hardware, software, or a combination of them. At block 541, controller 102 sends a read request to memory 101. At block 542, controller 102 finds the memory word address in memory bank 103 for the requested memory address, and then checks for a corresponding valid bit for that memory word. At block 543, controller 102 determines whether the valid bit is set (e.g., set to logic value 1). In the example of FIG. 5A, memory bank 103 has 8 words, where memory bank 103 is coupled with redundant word array 510 with 2 spare words. In this example, word number 4 is requested, an initial lookup in primary memory 103 finds that the valid bit is set. This means that word number 4 is disabled as indicated by the dashed pattern of work 508. The redundant word is then looked up as indicated by block 544. For example, the redundant word array 504 is queried for word number 4 and a match is found as spare data in array 510. The data contained in redundant word array 510 is then used as the substitute data as indicated by block 544. At block 545, the substitute data or spare is then corrected for any error. For example, ECC is applied to identify and/or correct bit errors. The corrected data is then forwarded to the requestor (e.g., controller 102). In some embodiments, if the valid bit is not set (e.g., it is set to logic value 0) for the memory address being requested for read, then the process proceeds to block 545 where ECC is applied to the retrieved data and the data is then retuned to memory controller 102.

Figure 6A:
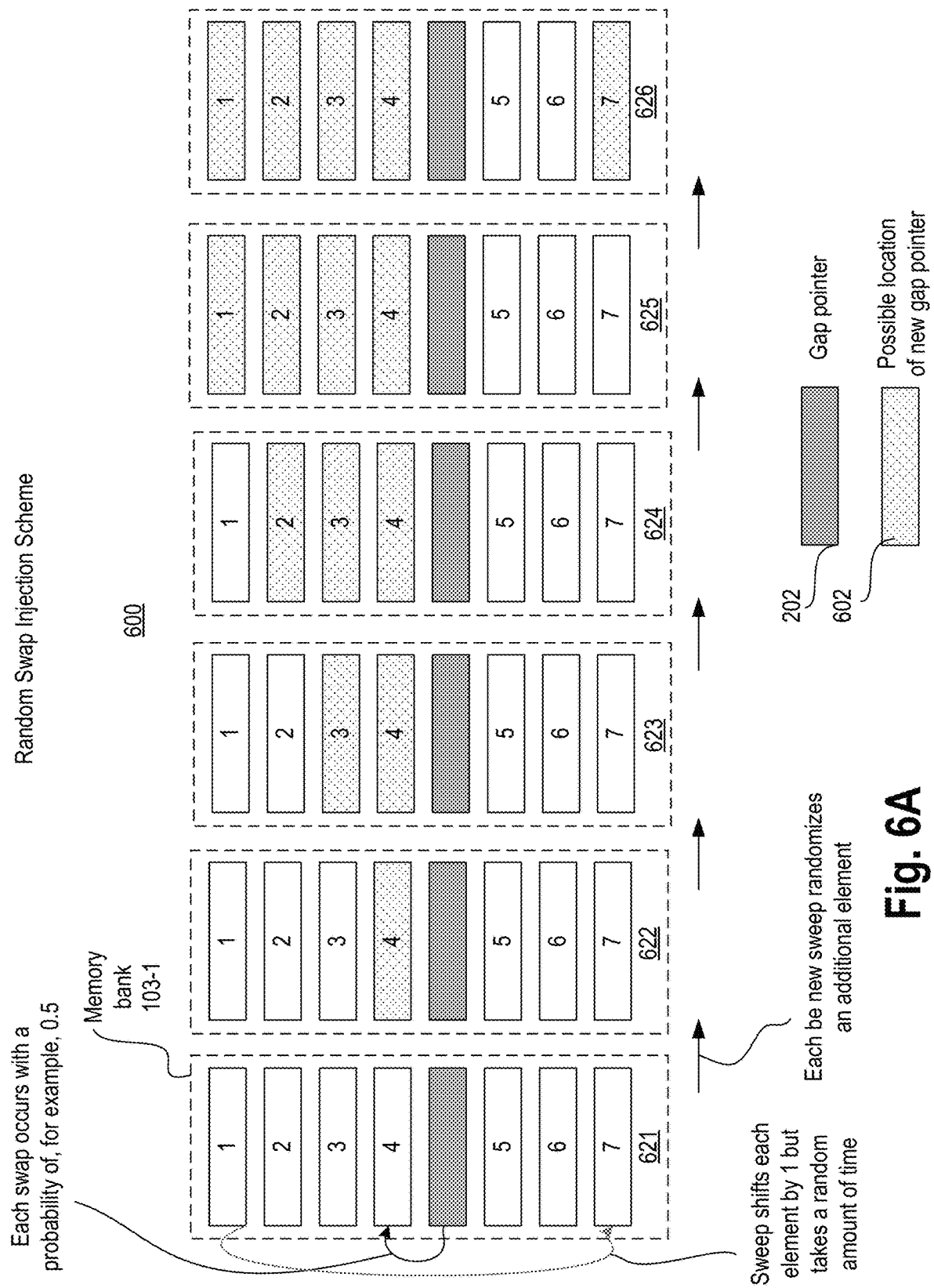
FIG. 6A illustrates a wear out attack mitigation scheme (using random swap injection) for a ferroelectric memory bank, in accordance with some embodiments.

FIG. 6A illustrates wear-out attack mitigation scheme 600 for a ferroelectric memory bank, in accordance with some embodiments. In some cases, malicious users (attackers) may write programs that deliberately track the linear wear leveling scheme described with reference to FIG. 2A. These attackers attempt to alter the memory reference pattern to continue to stress a single physical line even as the wear leveling scheme assigns that physical line to different addresses. Some embodiments provide a facility to make tracking of the physical lines difficult. This facility makes a random decision (using an externally generated random number, for example) to either swap or not each time a swap opportunity arises. Over time the randomness injected into the swapping process will make tracking cache lines more difficult.

FIG. 6A illustrates six snapshots (621, 622, 623, 624, 625, and 626) of memory bank 103-1 having eight words, where one word of cache line (shaded) is gap word with associated gap pointer 202. The figure shows the impact of random swap injection on the ability of an attacker to identify the physical location address under attack. The pattern words 602 indicate the potential locations of a particular word or cache line as sweeps are completed. The completion of each new sweep increases the number of possible locations by 1.

Figure 6B:
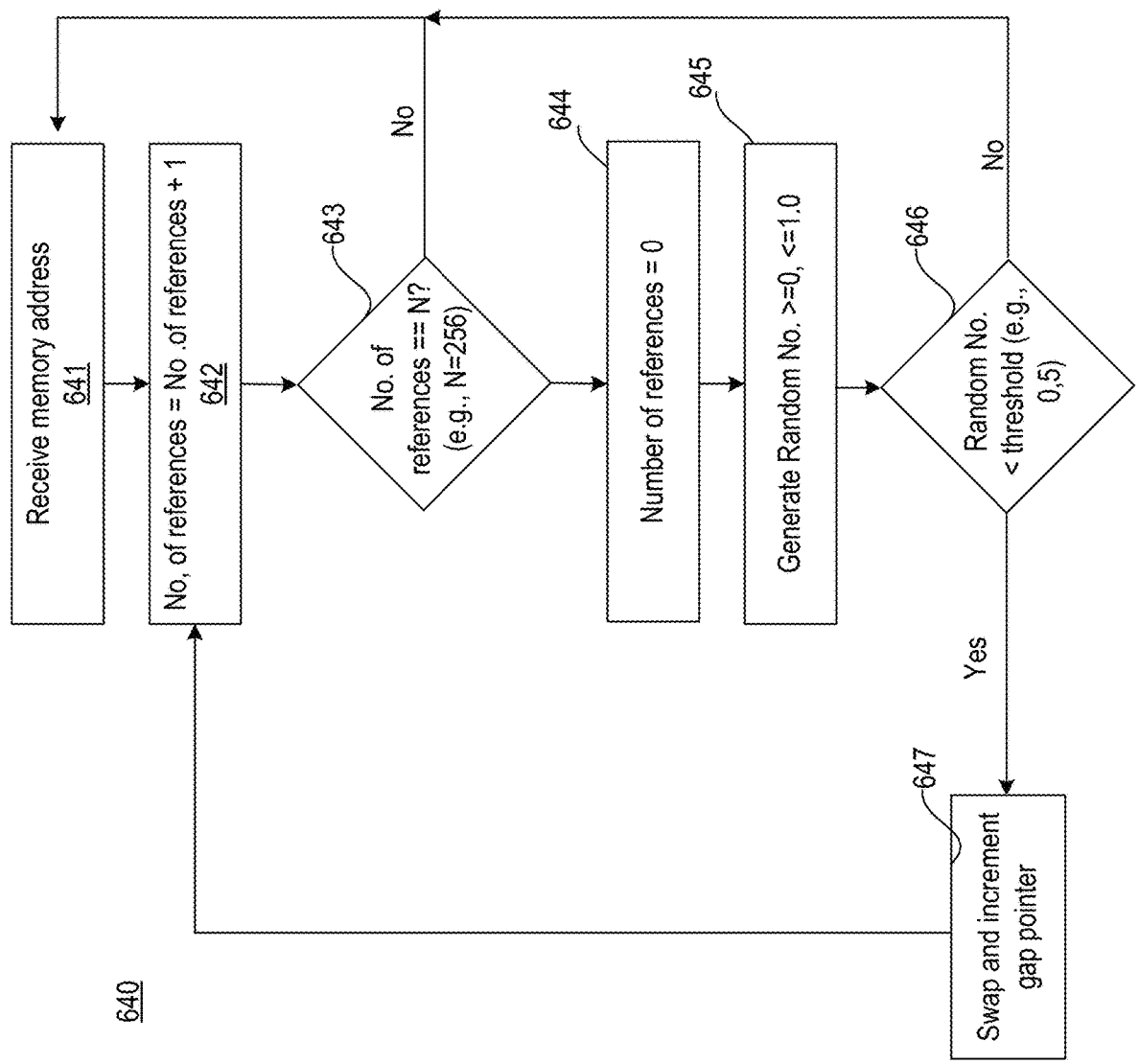
FIG. 6B illustrates a flowchart of memory endurance using random swap injection for wear leveling, in accordance with some embodiments.

FIG. 6B illustrates flowchart 640 of memory endurance using random swap injection for wear leveling, in accordance with some embodiments. The various blocks of the flowchart may be performed by hardware, software, or a combination of them. At block 641, controller 102 sends a write memory request to memory bank 103.

At block 242, the number of references (both write or read references) are counted and incremented by one. In some embodiments, a counter (e.g., a hardware or software counter) counts the number of references across memory bank 103 or cache. At block 243, a determination is made whether the number of references is equal to 'N', where 'N' may represent number of words or cache-lines in memory bank 103. If the number of references is not equal to N (e.g., number of references is less than N) then the process proceeds to block 241 where the next memory bank reference increments the number of references. Once the number of references becomes equal to N (e.g., a threshold of 256), the counter that tracks the number of references is reset. As such, at block 244, the number of references is set to zero. The next time the number of references is set to zero is when the counter counts to N again.

At block 644, controller 102 generates a random number with is greater or equal to 0 and less or equal to 1. Any suitable random number generator may be used by controller 102. At block 646, controller 102 checks the random number. If the random number is below a threshold (e.g., 0.5), the process proceeds to block 647 where a swap is performed and the gap pointer is incremented. The threshold or probability can be other than 0.5, in accordance with some embodiments. In various embodiments, the threshold is programmable by software and/or hardware. Upon performing the swap of word (as discussed with reference to FIG. 2B), the gap pointer is incremented. If the random number is above the threshold (e.g., 0.5) no swap is performed and the process proceeds to block 641 where controller 102 waits for next write access to services the next write operation.

FIG. 7 illustrates pseudocode 700 for random swap injection, in accordance with embodiments. Pseudocode 700 is a modified version of pseudocode 400. Here, the code snippet depicts the modified code for wear leveling after random swap injection is implemented. The mechanism relies on an external source for random numbers between 0 and 1. If the random number is below a threshold (e.g., 0.5), a swap is performed, if the number is above the threshold (e.g., 0.5) no swap is performed. In some embodiments, pseudocode 700 is implemented in a hardware description language (HDL) which is synthesized in hardware form as part of controller 102. In some embodiments, the hardware can be controlled by firmware or software. For example, gap pointer 202 can be randomized using a random number generator which may be a software (or hardware or a combination of them).

Figure 8:
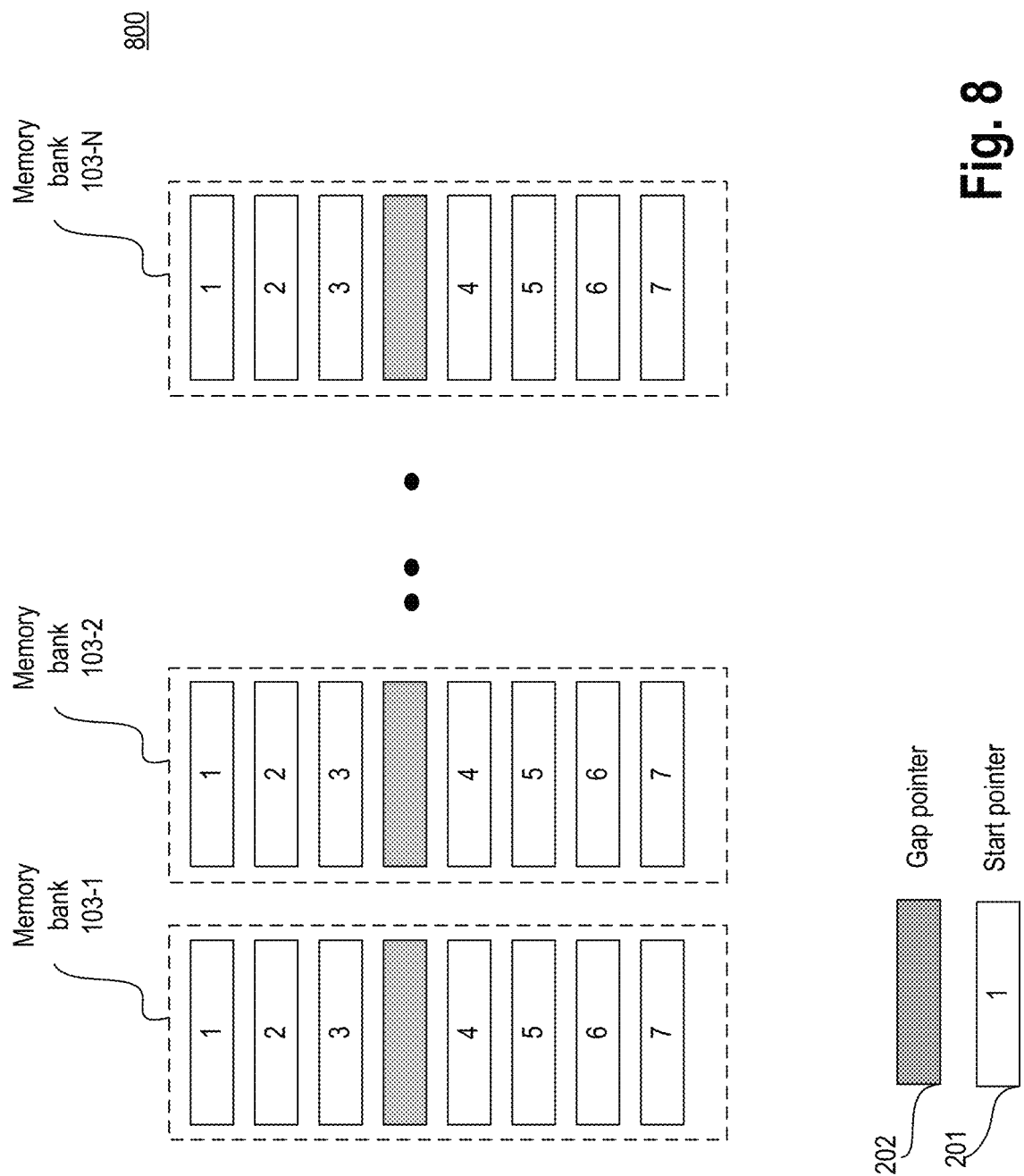
FIG. 8 illustrates a wear leveling scheme where memory banks share gap and start pointers, in accordance with some embodiments.

FIG. 8 illustrates a wear leveling scheme 800 where memory banks share gap and start pointers, in accordance with some embodiments. In scheme 800 some of all memory banks 103-1 through 103-N share start pointer 201 and gap pointer 202. Each memory bank forms a memory region. In various embodiments, multiple gaps (3 in the example) and swapping can be done on the three gaps simultaneously in the case of a multi-banked or multi ported memory. For example, memory word or cache-line swap(s) are performed concurrently (or substantially concurrently) in the various memory banks. In some embodiments, multiple gaps (3 in the example) and swapping can be done on the three gaps in a round robin fashion. For example, memory word or cache-line swap(s) are performed in one memory region or bank and then the other. A multi-region or multi-bank wear leveling scheme reduces the average latency between sweeps and provides better wear leveling reducing the intensity of accesses to specific cache lines. Multi-region or multi-bank wear leveling can be implemented in two different ways. FIG. 8 illustrates the case that applies a single set of start and gap pointers, 201 and 202, respectively. In this case, memory banks are split into even portions per bank and the gap and start pointers move in lock step through the memory banks.

Figure 9:
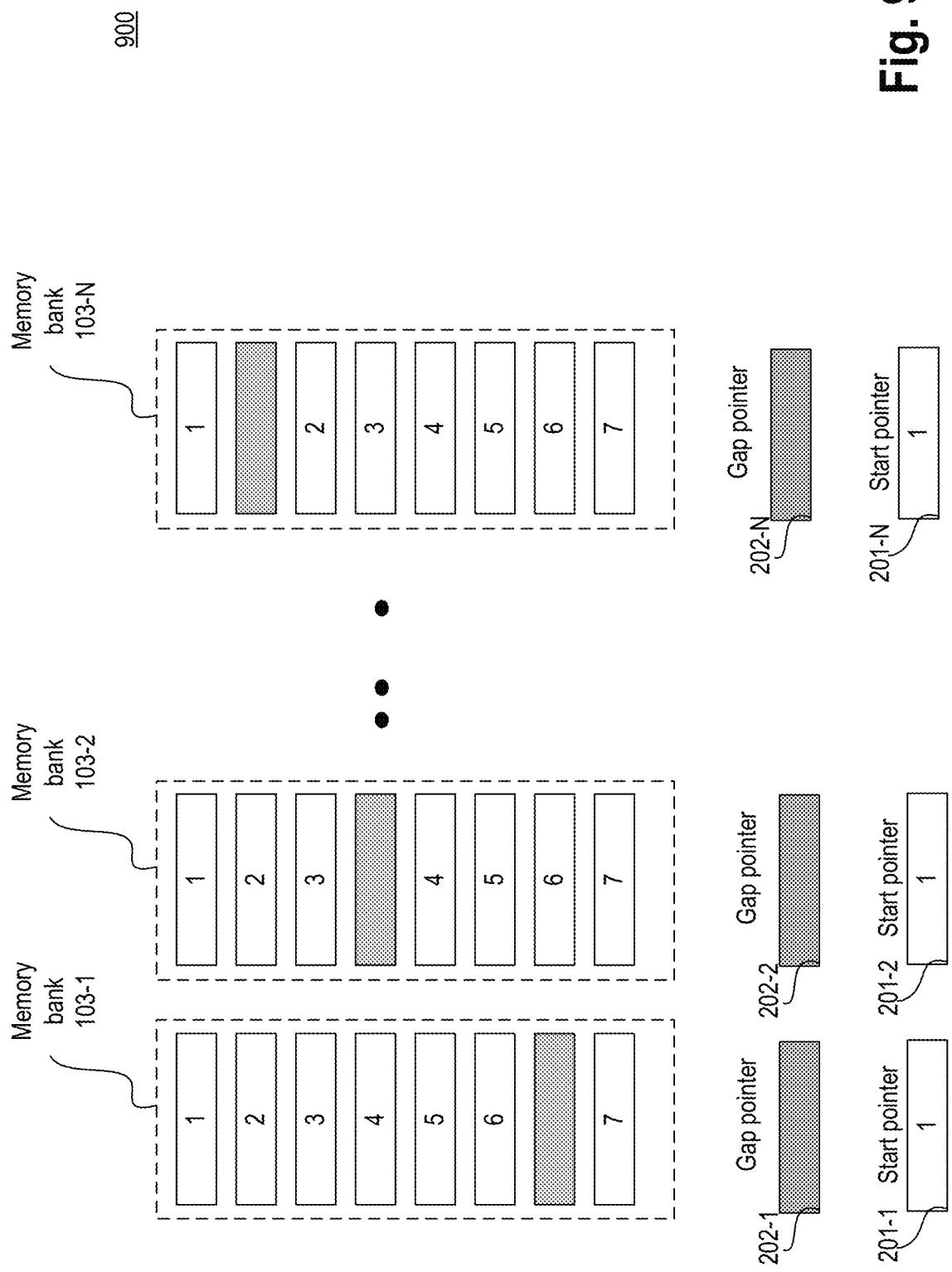
FIG. 9 illustrates a wear leveling scheme where memory banks have separate gap and start pointers, in accordance with some embodiments.

FIG. 9 illustrates wear leveling scheme 900 where memory banks have separate gap and start pointers, in accordance with some embodiments. Compared to multi-bank wear leveling in FIG. 8, here separate sets of start and pointers are used. For example, memory bank 103-1 uses start pointer 201-1 and gap pointer 202-1, memory bank 103-2 uses start pointer 201-2 and gap pointer 202-2, and memory bank 103-N uses start pointer 201-N and gap pointer 202-N. This allows the memory banks to use different swap rates which help with obfuscating memory locations and allow higher swap rates in memory regions or banks where more memory requests are being served. In some embodiments, schemes 800 and 900 can be combined. In some embodiments, the various wear leveling schemes discussed herein can be combined. For example, some sets of memory banks use wear leveling with linear indexing, some sets of memory banks use wear leveling with random indexing, some set of memory banks use wear leveling with shared gap and start points, while some sets of memory banks use wear leveling with separate gap and start pointers. FIGS. 8-9 show a start pointer of value 0.

Figure 10:
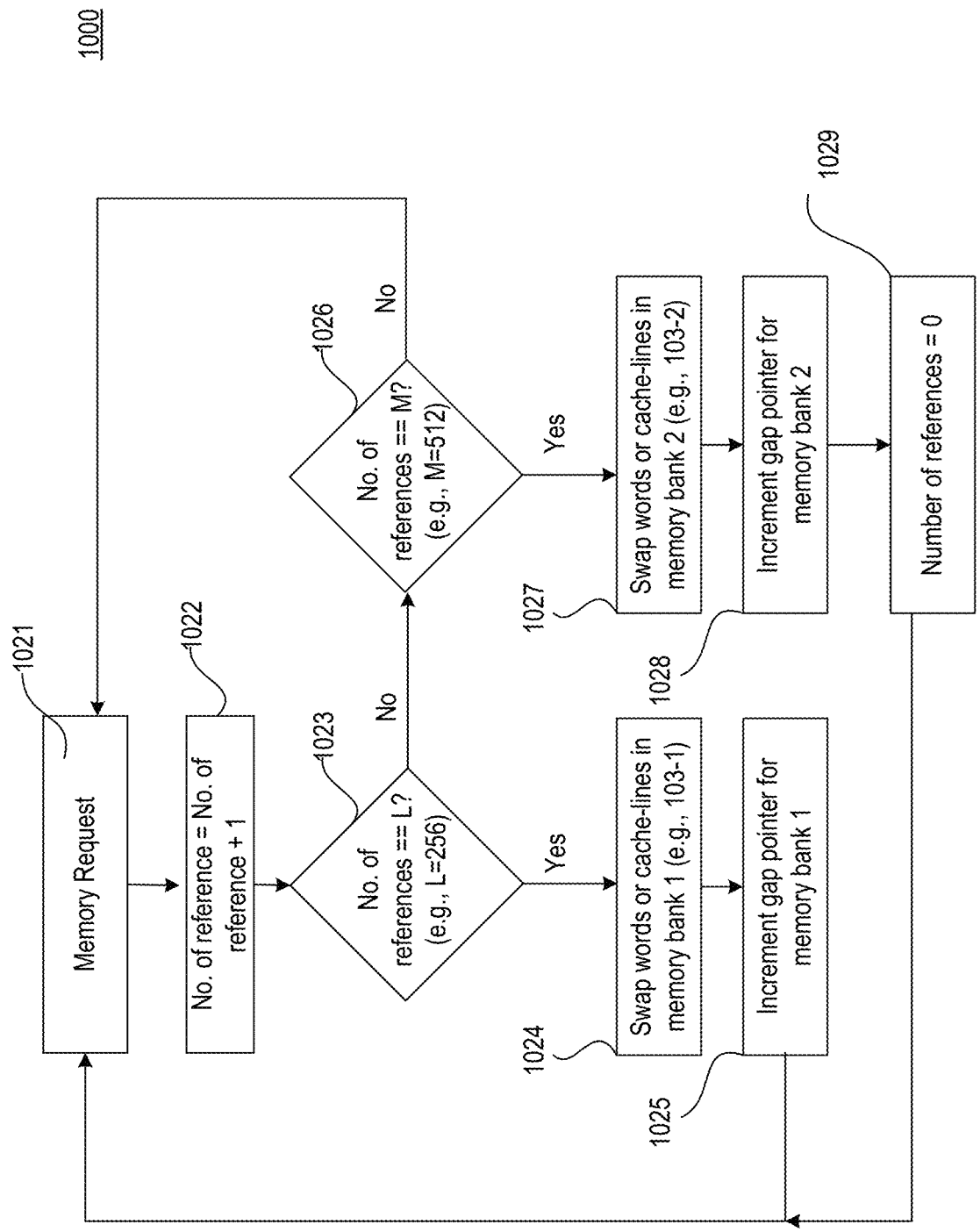
FIG. 10 illustrates a flowchart of a wear leveling method where swaps are performed in a round robin manner, in accordance with some embodiments.

FIG. 10 illustrates flowchart 1000 of a wear leveling method where swaps are performed in a round robin manner, in accordance with some embodiments. The various blocks of the flowchart may be performed by hardware, software, or a combination of them. While the blocks of operation are shown in a particular order, the order can be modified. For example, some blocks can be performed simultaneously with other blocks. In this example, memory 101 is divided into two regions or banks and swaps are performed in each region or bank in an alternating manner.

In some embodiments, at block 1021, upon receiving a memory write access, controller 102 performs wear leveling. At block 1022, the number of references (both write or read references) are counted and incremented by one. In some embodiments, a counter (e.g., a hardware or software counter) counts the number of references across memory bank 103 (e.g., 103-1) or cache. At block 1023, a determination is made whether the number of references is equal 'L', to where 'L' may represent number (e.g., 256) of words or cache-lines in memory bank 103 (e.g., 103-1). If the number of references is not equal to L (e.g., number of references is less than L) then the process proceeds to block 1026. At block 1024, gap word is swapped with an adjacent word or cache line, and data is written to the swapped word. As such, writing to memory bank 103 (e.g., 103-1) is performed in different words instead of the same word because after each swap, a single memory location has moved to the adjacent memory location. At block 1025, the gap pointer is incremented to allow the next write to memory bank 103 (e.g., 103-1) to be done on another swapped memory word. The process them proceeds to block 1021.

As discussed herein if the number of references is not equal to L (e.g., number of references is less than L) then the process proceeds to block 1026 where the next memory bank reference increments the number of references. At block 1026, a determination is made whether the number of references is equal to 'M', where 'M' may represent number (e.g., 512) of words or cache-lines in memory bank 103 (e.g., 103-2). If the number of references is not equal to M (e.g., number of references is less than M) then the process proceeds to block 1021 where the next memory bank reference increments the number of references. At block 1027, gap word is swapped with an adjacent word or cache line, and data is written to the swapped word. As such, writing to memory bank 103 (e.g., 103-2) is performed in different words instead of the same word because after each swap, a single memory location has moved to the adjacent memory location. At block 1026, the gap pointer is incremented to allow the next write to memory bank 103 (e.g., 103-2) to be done on another swapped memory word. After incrementing the gap pointer, the counter that tracks the number of references is reset. As such, at block 1029, the number of references is set to zero.

While the embodiments are illustrated with respect to incrementing the number of references using an up-counter, flowchart 1000 can be modified to start the number of reference count at L or M and decrementing it down to zero and then presetting number of references to L or M once the number of references reaches zero. While the embodiments here show 2 regions, the number of regions can be more than 2 and flowcharts can be expanded to those memory regions.

Figure 11:
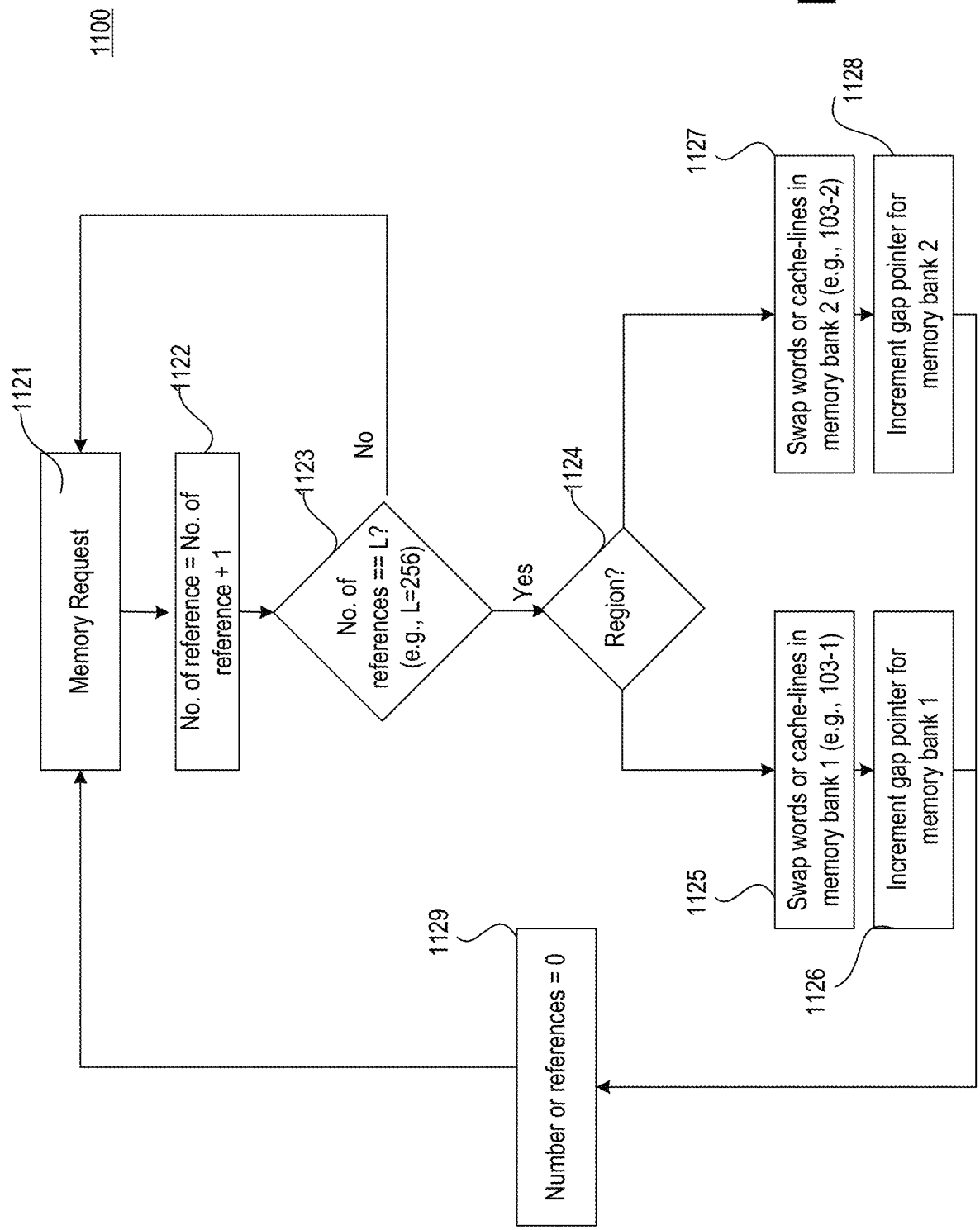
FIG. 11 illustrates a flowchart of a wear leveling method where memory is divided into regions (e.g., banks) and a region selector selects a region where memory words or cache-lines are swapped, in accordance with some embodiments.

FIG. 11 illustrates flowchart 1100 of a wear leveling method where memory is divided into regions (e.g., banks) and a region selector selects a region where memory words or cache-lines are swapped, in accordance with some embodiments. The various blocks of flowchart 1100 may be performed by hardware, software, or a combination of them. While the blocks of operation are shown in a particular order, the order can be modified. For example, some blocks can be performed simultaneously with other blocks. In this example, memory 101 is divided into two regions or banks and a region selector selects a region where memory words or cache-lines are swapped.

In some embodiments, at block 1121, upon receiving a memory write access, controller 102 performs wear leveling. At block 1122, the number of references (both write or read references) are counted and incremented by one. In some embodiments, a counter (e.g., a hardware or software counter) counts the number of references across memory bank 103 (e.g., 103-1) or cache. At block 1123, a determination is made whether the number of references is equal to where 'L' may represent number (e.g., 256) of words or cache-lines in memory bank 103 (e.g., 103-1). If the number of references is not equal to L (e.g., number of references is less than L) then the process proceeds to block 1121, and the number of references is incremented upon a next memory request. At block 1124, a region selector (e.g., logic in controller 102) selects a region of memory 101 where memory words or cache-lines are swapped (e.g., linearly or randomly).

If the region selector selects region 1 (e.g., bank 1 or 103-1) then at block 1125, gap word is swapped with an adjacent word or cache line, and data is written to the swapped word. At block 1126, the gap pointer is incremented to allow the next write to memory bank 103 (e.g., 103-1) to be done on another swapped memory word. The process them proceeds to block 1129. After incrementing the gap pointer, the counter that tracks the number of references is reset. As such, at block 1129, the number of references is set to zero. While the embodiments are illustrated with respect to incrementing the number of references using an up-counter, flowchart 1100 can be modified to start the number of reference count at L and decrementing it down to zero and then presetting number of references to L once the number of references reaches zero.

If the region selector selects region 2 (e.g., bank 2 or 103-2) then at block 1127, gap word is swapped with an adjacent word or cache line, and data is written to the swapped word. At block 1128, the gap pointer is incremented to allow the next write to memory bank 103 (e.g., 103-2) to be done on another swapped memory word. The process them proceeds to block 1129. After incrementing the gap pointer, the counter that tracks the number of references is reset as indicated by block 1129.

In some embodiments, the region selector might choose to allocate more swaps to a region that is accessed more heavily and might make this determination in a variety of ways. This implementation may use two sets of start gap pointers to allow different swap rates in the two regions as discussed with reference to FIG. 10.

Figure 12:
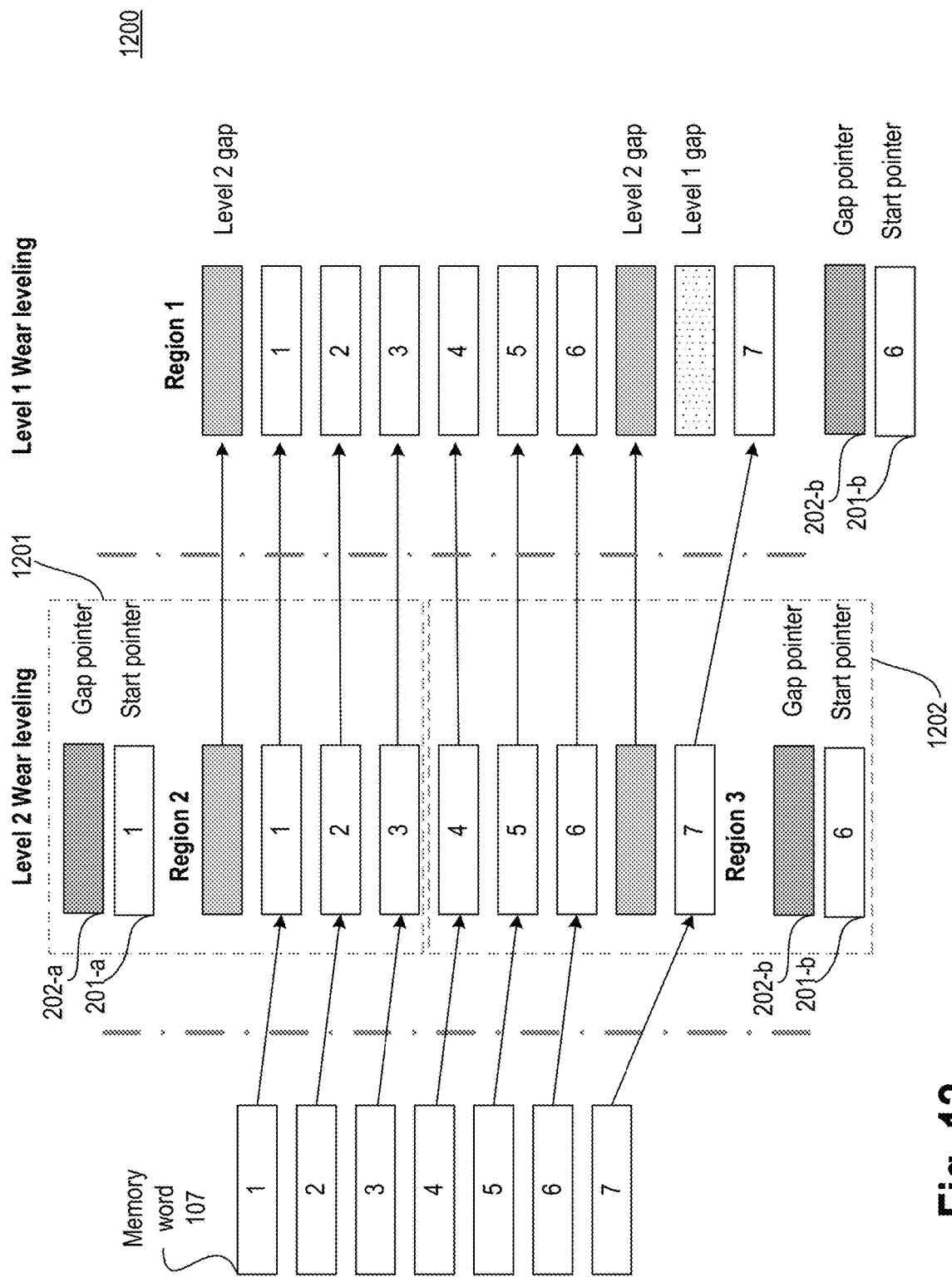
FIG. 12 illustrates a wear leveling scheme where multiple remapping algorithms are layered over each other, in accordance with some embodiments.

FIG. 12 illustrates wear leveling scheme 1200 where multiple remapping algorithms are layered over each other, in accordance with some embodiments. In some embodiments, each gap will use a separate gap and start pointer. In some embodiments, multi-region wear leveling are used on top of a single region wear leveling scheme. Each wear leveling scheme uses swaps with the gap and start pointers associated with that region. For example, region 2 1201 uses start pointer 201-a and gap pointer 202-a, while region 3 uses start pointer 201-b and gap pointer 202-b.

In some embodiments, swaps are applied in a round robin fashion or using another algorithm. FIG. 12 shows a 2-level implementation of this algorithm. Here, the level 1 wear leveling rotates cache lines throughout the entire memory while the level 2 wear leveling is region-based with 2 regions. Cache lines within these regions are swapped with other cache lines in the same region. In this implementation, three additional cache lines are used as gap lines, one additional line is used for the level 1 wear leveling, which contains region 1. Two additional lines are used for the level 2 wear leveling, which uses 2 gaps, one each for region 2 and region 3.

Swaps are allocated to the 3 regions independently, with the region selector choosing between regions 2 and 3 in level 2 and region 1 in level 1. Again, different algorithms might be used to choose which regions should be swapped. Half the swaps might be allocated to regions 3 and 2 depending on which regions is more heavily accessed as discussed above and the remaining 50% of the swaps might be allocated to region 1 to ensure that wear leveling is performed across the entire cache rather than in a single region.

Figure 13:
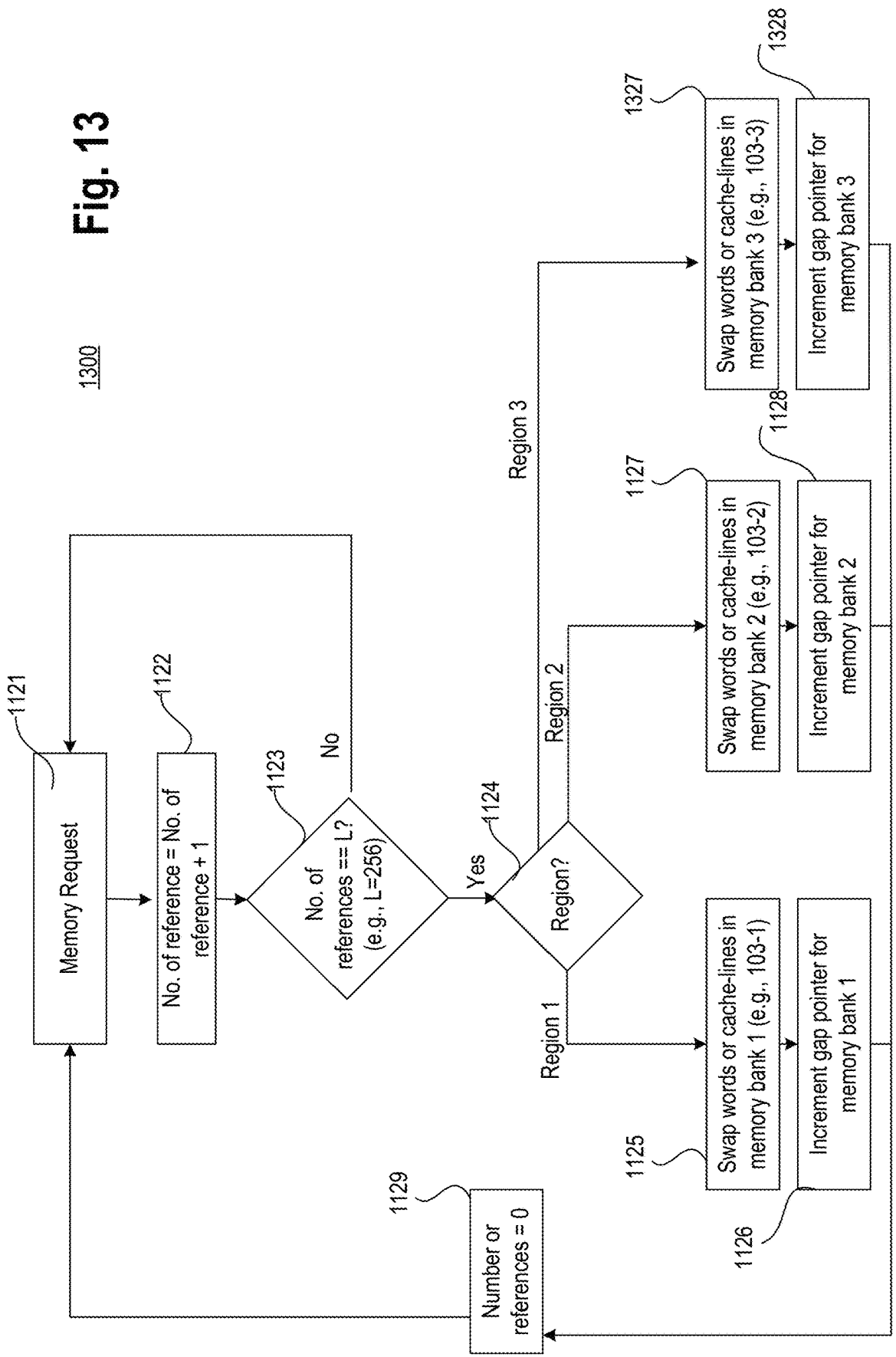
FIG. 13 illustrates flowchart of wear leveling scheme where multiple remapping algorithms are layered over each other, in accordance with some embodiments.

FIG. 13 illustrates flowchart 1300 of wear leveling scheme 1200 where multiple remapping algorithms are layered over each other, in accordance with some embodiments. The various blocks of flowchart 1300 may be performed by hardware, software, or a combination of them. While the blocks of operation are shown in a particular order, the order can be modified. For example, some blocks can be performed simultaneously with other blocks. In this example, memory 101 is divided into three regions or banks and a region selector selects a region where memory words or cache-lines are swapped. Flowchart 1300 is similar to flowchart 1100 but for additional block 1227 and 1228.

Swaps are allocated to the 3 regions independently, with the region selector choosing at block 1124 between regions 2 and 3 in level 2 and region 1 in level 1. In some embodiments, different algorithms might be used to choose which regions should be swapped. Half the swaps might be allocated to regions 3 and 2 depending on which regions is more heavily accessed as discussed above and the remaining 50% of the swaps might be allocated to region 1 to ensure that wear leveling is performed across the entire cache rather than in a single region. If the region selector selects region 3 (e.g., bank 3 or 103-3) then at block 1327, gap word is swapped with an adjacent word or cache line, and data is written to the swapped word. At block 1328, the gap pointer is incremented to allow the next write to memory bank 103 (e.g., 103-3) to be done on another swapped memory word. The process them proceeds to block 1129. After incrementing the gap pointer, the counter that tracks the number of references is reset as indicated by block 1129. While the embodiments here show 3 regions, the number of regions can be more than 3 and flowcharts can be expanded to those memory regions.

Figure 14:
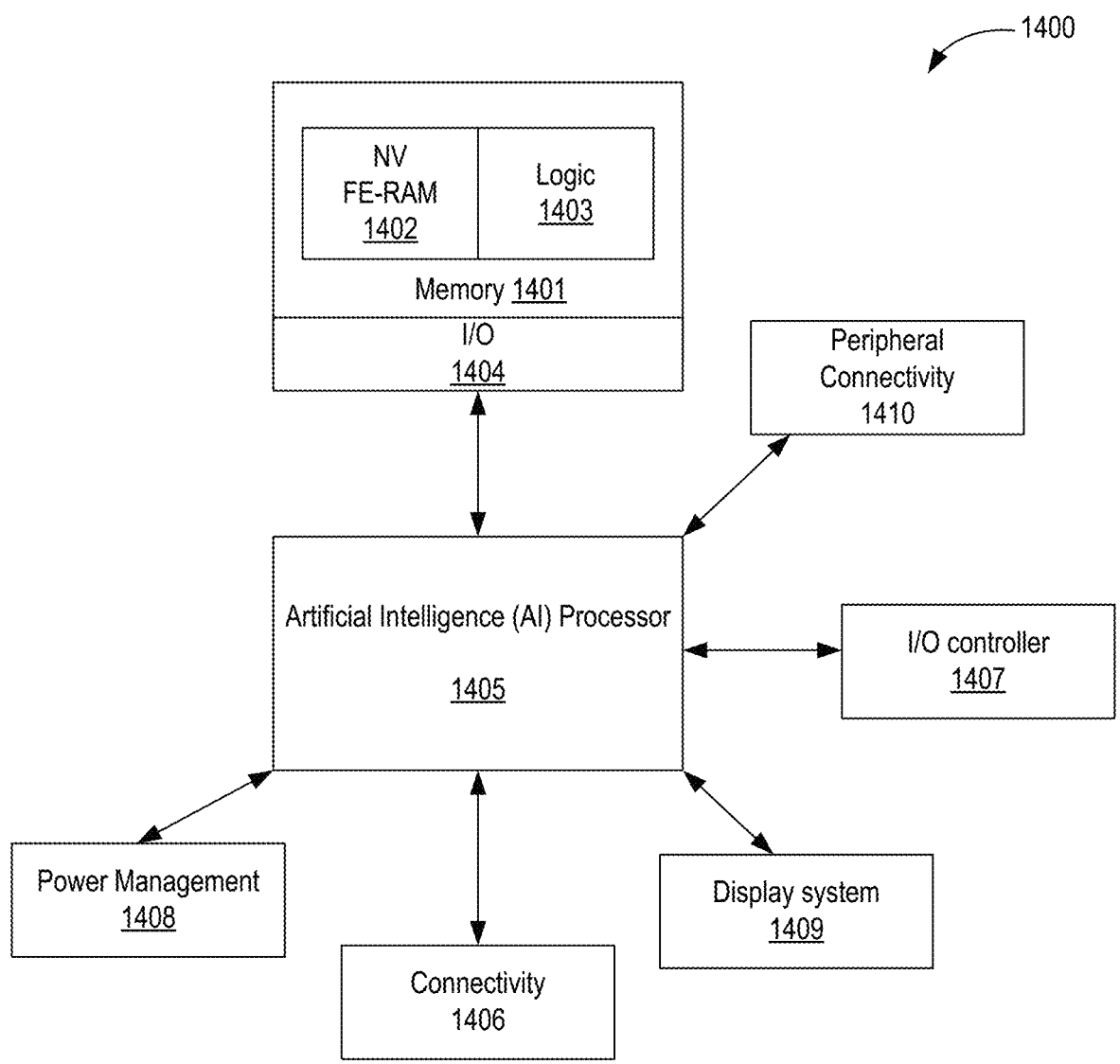
FIG. 14 illustrates a system-on-chip (SOC) that uses ferroelectric memory with endurance enhancement, in accordance with some embodiments.

FIG. 14 illustrates a system-on-chip (SOC) that uses ferroelectric memory with endurance enhancement, in accordance with some embodiments. SOC 1400 comprises memory 1401 having static random-access memory (SRAM) or FE based random access memory FE-RAM, or any other suitable memory. The memory can be non-volatile (NV) or volatile memory. Memory 1401 may also comprise logic 1403 to control memory 1402. For example, write and read drivers are part of logic 1403. In various embodiments, the endurance mechanisms are applicable to the memories of any of the blocks described here.

SOC further comprises a memory I/O (input-output) interface 1404. The interface may be double-data rate (DDR) compliant interface or any other suitable interface to communicate with a processor. Processor 1405 of SOC 1400 can be a single core or multiple core processor. Processor 1405 can be a general-purpose processor (CPU), a digital signal processor (DSP), graphics processor, or an Application Specific Integrated Circuit (ASIC) processor. In some embodiments, processor 1405 is an artificial intelligence (AI) processor (e.g., a dedicated AI processor, a graphics processor configured as an AI processor). In various embodiments, processor 1405 is a processor circuitry which is to execute one or more instructions.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 1405 has reduced latency of computing the training model and using the training model, which reduces the power consumption of such AI processor systems.

Processor 1405 may be coupled to a number of other chip-lets that can be on the same die as SOC 1400 or on separate dies. These chip-lets include connectivity circuitry 1406, I/O controller 1407, power management 1408, and display system 1409, and peripheral connectivity 1410.

Connectivity 1406 represents hardware devices and software components for communicating with other devices. Connectivity 1406 may support various connectivity circuitries and standards. For example, connectivity 1406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1406 may support non-cellular standards such as WiFi.

I/O controller 1407 represents hardware devices and software components related to interaction with a user. I/O controller 1407 is operable to manage hardware that is part of an audio subsystem and/or display subsystem. For example, input through a microphone or other audio device can provide input or commands for one or more applications or functions of SOC 1400. In some embodiments, I/O controller 1407 illustrates a connection point for additional devices that connect to SOC 1400 through which a user might interact with the system. For example, devices that can be attached to the SOC 1400 might include microphone devices, speaker or stereo systems, video systems or other display devices, keyboard or keypad devices, or other I/O devices for use with specific applications such as card readers or other devices.

Power management 1408 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1408 may accordingly put such logic into low power state without the worry of losing data. Power management may select a power state according to Advanced Configuration and Power Interface (ACPI) specification for one or all components of SOC 1400.

Display system 1409 represents hardware (e.g., display devices) and software (e.g., drivers) components that provide a visual and/or tactile display for a user to interact with the processor 1405. In some embodiments, display system 1409 includes a touch screen (or touch pad) device that provides both output and input to a user. Display system 1409 may include a display interface, which includes the particular screen or hardware device used to provide a display to a user. In some embodiments, the display interface includes logic separate from processor 1405 to perform at least some processing related to the display.

Peripheral connectivity 1410 may represent hardware devices and/or software devices for connecting to peripheral devices such as printers, chargers, cameras, etc. Peripheral connectivity 1410 may support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a memory organized in a plurality of memory banks, wherein the plurality of memory banks comprises memory bit-cells, wherein an individual memory bit-cell includes a non-volatile material to store data, wherein the non-volatile material includes one of: non-linear polar material, a magnet, or a resistive material; and a memory controller coupled to the memory, wherein the memory controller includes one or more circuitries configured to improve memory endurance of the memory via wear leveling, wherein the wear leveling is applied during read or write operations to the memory.

Example 2: The apparatus of example 1, wherein an individual memory bank of the plurality of memory banks includes N cache lines or words and a gap word.

Example 3: The apparatus of example 2, wherein the memory controller is to request a write to an address of the individual memory bank, wherein the request is a reference to the individual memory bank, wherein a number of references is incremented by one upon a request.

Example 4: The apparatus of example 3, wherein the memory controller compares the number of references with a threshold.

Example 5: The apparatus of example 4, wherein the memory controller is to reset the number of references if the number of references is equal to the threshold.

Example 6: The apparatus of example 5, wherein the one or more circuitries are configured to swap the gap word with an adjacent cache line or word in response to the number of references is equal to the threshold.

Example 7: The apparatus of example 6, wherein the gap word has an associated gap pointer, wherein the one or more circuitries is to increment the gap pointer after the swap.

Example 8: The apparatus of example 1, wherein the non-volatile material includes a non-linear polar material, wherein the non-linear polar material includes one of: ferroelectric material, paraelectric material, or non-linear dielectric.

Example 9: The apparatus of example 8, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as Hf1−x Ex Oy, where E can be Al, Ca, Ce, Dy, er, Gd, Ge, La, Sc, Si, Sr, Sn, or Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 10: The apparatus of example 8, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 11: The apparatus of example 1, wherein the wear leveling includes a random wear leveling scheme.

Example 12: The apparatus of example 1, wherein the memory controller is to apply an outlier compensation scheme before or after the wear leveling.

Example 13: The apparatus of example 1, wherein the memory controller is to refresh the non-volatile material.

Example 14: A method to improve memory endurance of the memory via wear leveling, the method comprising: requesting a write to an address of an individual memory bank, wherein the individual memory bank is part of a plurality of memory banks comprising memory bit cells, wherein an individual memory bit-cell includes a capacitor comprising non-linear polar material, wherein the request is a reference to the individual memory bank, wherein an individual memory bank of the plurality of memory banks includes N cache lines or words and a gap word; incrementing a number of references by one upon the requesting; comparing the number of references with a threshold; and swapping the gap word with an adjacent cache line or word in response to the number of references is equal to the threshold.

Example 15: The method of example 14 comprising resetting the number of references if the number of references is equal to the threshold.

Example 16: The method of example 15, wherein the gap word has an associated gap pointer, wherein the method comprising incrementing the gap pointer after the swapping.

Example 17: The method of example 14, wherein the non-linear polar material includes one of: ferroelectric material, paraelectric material, or non-linear dielectric.

Example 18: The method of example 17, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as Hf1−x Ex Oy, where E can be Al, Ca, Ce, Dy, er, Gd, Ge, La, Sc, Si, Sr, Sn, or Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 19: The method of example 17, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 20: A system comprising: a memory organized in a plurality of memory banks, wherein the plurality of memory banks comprises memory bit-cells, wherein an individual memory bit-cell includes a capacitor comprising non-linear polar material; a processor circuitry coupled to the memory; a memory controller coupled to the memory and the processor circuitry, wherein the memory controller includes one or more circuitries configured to improve memory endurance of the memory via wear leveling; and a communication interface to allow the processor circuitry to communicate with another device.

Example 21: The system of example 20, wherein an individual memory bank of the plurality of memory banks includes N cache lines or words and a gap word.

Example 22: The system of example 21, wherein the memory controller is to: request a write to an address of the individual memory bank, wherein the request is a reference to the individual memory bank, wherein a number of references is incremented by one upon a request; compares the number of references with a threshold; reset the number of references if the number of references is equal to the threshold; and swap the gap word with an adjacent cache line or word in response to the number of references is equal to the threshold.

Example 23: The system of example 22, wherein the gap word has an associated gap pointer, wherein the one or more circuitries is to increment the gap pointer after the swap, wherein the non-linear polar material includes one of: ferroelectric material, paraelectric material, or non-linear dielectric.

Example 1a: An apparatus comprising: a memory organized in a plurality of memory banks, wherein the plurality of memory banks comprises memory bit-cells, wherein an individual memory bit-cell includes a capacitor comprising non-linear polar material; and a memory controller coupled to the memory, wherein the memory controller includes one or more circuitries configured to improve memory endurance of the memory via wear leveling with random indexing.

Example 2a: The apparatus of example 1a, wherein the memory controller is to request a write to an address of the individual memory bank, wherein the request is a reference to the individual memory bank, wherein a number of references is incremented by one upon a request.

Example 3a: The apparatus of example 2a, wherein the memory controller compares the number of references with a threshold.

Example 4a: The apparatus of example 3a, wherein the memory controller is to reset the number of references if the number of references is equal to the threshold.

Example 5a: The apparatus of example 4a, wherein an individual memory bank of the plurality of memory banks includes N cache lines or words and a gap word.

Example 6a: The apparatus of example 5a, wherein the one or more circuitries are configured to swap the gap word with a cache line or word after it is determined that the number of references is equal to the threshold.

Example 7a: The apparatus of example 6a comprises a random number generator to generate a random number between 0 and 1 for random indexing.

Example 8a: The apparatus of example 7a, wherein the one or more circuitries are configured to swap the gap word with a cache line or word in response to the request and based on the random number being less than 0.5.

Example 9a: The apparatus of example 8a, wherein the gap word has an associated gap pointer, wherein the one or more circuitries is to increment the gap pointer after the swap.

Example 10a: The apparatus of example 1a, wherein the non-linear polar material includes one of: ferroelectric material, paraelectric material, or non-linear dielectric.

Example 11a: The apparatus of example 10a, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as lift Hf1−x Ex Oy, where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 12a: The apparatus of example 10a, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 13a: A method to improve memory endurance, the method comprising: requesting a write to an address of an individual memory bank, wherein the individual memory bank is part of a plurality of memory banks comprising memory bit cells, wherein an individual memory bit-cell includes a capacitor comprising non-linear polar material, wherein the request is a reference to the individual memory bank, wherein an individual memory bank of the plurality of memory banks includes N cache lines or words and a gap word; incrementing a number of references by one upon the requesting; comparing the number of references with a threshold; generating a random number between zero and one in response to the comparing indicating that the number of references is equal to the threshold; and applying the random number to swap the gap word with a cache line or word.

Example 14a: The method of example 13a comprising resetting the number of references if the number of references is equal to the threshold.

Example 15a: The method of example 13a, wherein the gap word has an associated gap pointer, wherein the method comprising incrementing the gap pointer after the swapping.

Example 16a: The method of example 13a, wherein the non-linear polar material includes one of: ferroelectric material, paraelectric material, or non-linear dielectric.

Example 17a: The method of example 16a, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as Hf1−x Ex Oy, where E can be Al, Ca, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 18a: The apparatus of example 16a, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 19a: A system comprising: a memory organized in a plurality of memory banks, wherein the plurality of memory banks comprises memory bit-cells, wherein an individual memory bit-cell includes a capacitor comprising non-linear polar material; a processor circuitry coupled to the memory; a memory controller coupled to the memory and the processor circuitry, wherein the memory controller is to improve memory endurance of the memory via wear leveling with random indexing; and a communication interface to allow the processor circuitry to communicate with another device.

Example 20a: The system of example 19a, wherein the memory controller is to request a write to an address of the individual memory bank, wherein the request is a reference to the individual memory bank, wherein a number of references is incremented by one upon a request; compare the number of references with a threshold; reset the number of references if the number of references is equal to the threshold, wherein an individual memory bank of the plurality of memory banks includes N cache lines or words and a gap word; generate a random number between 0 and 1 for random indexing; and swap the gap word with a cache line or word in response to the request and based on the random number being less than 0.5.

Example 1b: An apparatus comprising: a memory organized in a plurality of memory banks, wherein the plurality of memory banks comprises memory bit-cells, wherein an individual memory bit-cell includes a capacitor comprising non-linear polar material, wherein an individual memory bank has an associated valid bit; and a memory controller coupled to the memory, wherein the memory controller includes one or more circuitries configured to improve memory endurance of the memory according to a value of the valid bit.

Example 2b: The apparatus of example 1b, wherein the memory controller is to read the value of the valid bit for a cache line or word of the individual memory bank.

Example 3b: The apparatus of example 2b, wherein the memory controller is to lookup a redundant memory for data if the value of the valid bit indicates it is set.

Example 4b: The apparatus of example 3b, wherein the memory controller is to apply an error correction code to the data from the redundant memory if the value of the valid bit indicates it is set.

Example 5b: The apparatus of example 1b, wherein the valid bit is stored in a SRAM.

Example 6b: The apparatus of example 3b, wherein the redundant memory comprises SRAM.

Example 7b: The apparatus of example 1b, wherein the non-linear polar material includes one of: ferroelectric material, paraelectric material, or non-linear dielectric.

Example 8b: The apparatus of example 7b, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as Hf1-x Ex Oy, where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 9b: The apparatus of example 7b, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 10b: A method to improve memory endurance of the memory, the method comprising: requesting a write to an address of an individual memory bank, wherein the individual memory bank is part of a plurality of memory banks comprising memory bit cells, wherein an individual memory bit-cell includes a capacitor comprising non-linear polar material, wherein the request is a reference to the individual memory bank, wherein an individual memory bank of the plurality of memory banks includes N cache lines or words; reading a value of a valid bit for a cache line or word from among the N cache lines or words; looking up a redundant memory for data if the value of the valid bit indicates it is set; and applying an error correction code to the data from the redundant memory if the value of the valid bit indicates it is set.

Example 11b: The method of example 10b, wherein the valid bit is stored in a SRAM.

Example 12b: The method of example 10b wherein the redundant memory comprises SRAM.

Example 13b: The method of example 10b, wherein the non-linear polar material includes one of: ferroelectric material, paraelectric material, or non-linear dielectric.

Example 14b: The method of example 13b, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as Hf1-x Ex Oy, where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 15b: The method of example 13b, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 16b: A system comprising: a memory organized in a plurality of memory banks, wherein the plurality of memory banks comprises memory bit-cells, wherein an individual memory bit-cell includes a capacitor comprising non-linear polar material, wherein an individual memory bank has an associated valid bit; a processor circuitry coupled to the memory; a memory controller coupled to the memory, wherein the memory controller includes one or more circuitries configured to improve memory endurance of the memory according to a value of the valid bit; and a communication interface to allow the processor circuitry to communicate with another device.

Example 17b: The system of example 16b, wherein the memory controller is to read the value of the valid bit for a cache line or word of the individual memory bank.

Example 18b: The system of example 18b, wherein the memory controller is to lookup a redundant memory for data if the value of the valid bit indicates it is set.

Example 19b: The system of example 18b, wherein the memory controller is to apply an error correction code to the data from the redundant memory if the value of the valid bit indicates it is set.

Example 20b: The system of example 16b, wherein the valid bit is stored in a SRAM, and wherein the redundant memory comprises SRAM.

Example 1c: An apparatus comprising: a memory organized in a plurality of memory banks, wherein the plurality of memory banks comprises memory bit-cells, wherein an individual memory bit-cell includes a capacitor comprising non-linear polar material; and a memory controller coupled to the memory, wherein the memory controller includes one or more circuitries configured to improve memory endurance of the memory via wear leveling and outlier compensation.

Example 2c: The apparatus of example 1c, wherein an individual memory bank of the plurality of memory banks includes N cache lines or words and a gap word.

Example 3c: The apparatus of example 2c, wherein the memory controller is to request a write to an address of the individual memory bank, wherein the one or more circuitries are configured to swap the gap word with an adjacent cache line or word in response to the request.

Example 4c: The apparatus of example 3c, wherein the gap word has an associated gap pointer, wherein the one or more circuitries is to increment the gap pointer after the swap.

Example 5c: The apparatus of example 1c, wherein the non-linear polar material includes one of: ferroelectric material, paraelectric material, or non-linear dielectric.

Example 6c: The apparatus of example 1c, wherein the wear leveling is with random indexing.

Example 7c: The apparatus of example 6c comprises a random number generator to generate a random number between 0 and 1 for random indexing.

Example 8c: The apparatus of example 7c, wherein an individual memory bank of the plurality of memory banks includes N cache lines or words and a gap word.

Example 9c: The apparatus of example 8c, wherein the memory controller is to request a write to an address of the individual memory bank, wherein the one or more circuitries are configured to swap the gap word with a cache line or word in response to the request and based on the random number being less than 0.5.

Example 10c: The apparatus of example 9c, wherein the gap word has an associated gap pointer, wherein the one or more circuitries is to increment the gap pointer after the swap.

Example 11c: The apparatus of example 1c, wherein an individual memory bank has an associated valid bit.

Example 12c: The apparatus of example 11c, wherein the memory controller is to improve memory endurance of the memory according to a value of the valid bit.

Example 13c: The apparatus of example 12c, wherein the memory controller is to read the value of the valid bit for the individual memory bank.

Example 14c: The apparatus of example 13c, wherein the memory controller is to lookup a redundant memory for data if the value of the valid bit indicates it is set.

Example 15c: The apparatus of example 14c, wherein the memory controller is to apply an error correction code to the data from the redundant memory if the value of the valid bit indicates it is set.

Example 16c: The apparatus of example 11c, wherein the valid bit is stored in a SRAM, wherein the redundant memory comprises SRAM.

Example 17c: A method to improve memory endurance of the memory via wear leveling, the method comprising: requesting a write to an address of an individual memory bank, wherein the individual memory bank is part of a plurality of memory banks comprising memory bit cells, wherein an individual memory bit-cell includes a capacitor comprising non-linear polar material, wherein the request is a reference to the individual memory bank, wherein an individual memory bank of the plurality of memory banks includes N cache lines or words and a gap word; incrementing a number of references by one upon the requesting; comparing the number of references with a threshold; swapping the gap word with an adjacent cache line or word in response to the number of references is equal to the threshold; requesting a read to an address of the individual memory bank; reading a value of a valid bit for a cache line or word from among the N cache lines or words, in response to the read request; looking up a redundant memory for data if the value of the valid bit indicates it is set; and applying an error correction code to the data from the redundant memory if the value of the valid bit indicates it is set.

Example 18c: The method of example 17c, wherein the valid bit is stored in a SRAM, and wherein the redundant memory comprises SRAM.

Example 19c: A system comprising: a memory organized in a plurality of memory banks, wherein the plurality of memory banks comprises memory bit-cells, wherein an individual memory bit-cell includes a capacitor comprising non-linear polar material; a processor circuitry coupled to the memory; a memory controller coupled to the memory, wherein the memory controller includes one or more circuitries configured to improve memory endurance of the memory via wear leveling and outlier compensation; and a communication interface to allow the processor circuitry to communicate with another device.

Example 20c: The system of example 19c, wherein the memory controller is to: read the value of the valid bit for a cache line or word of the individual memory bank; lookup a redundant memory for data if the value of the valid bit indicates it is set; apply an error correction code to the data from the redundant memory if the value of the valid bit indicates it is set, wherein the valid bit is stored in a SRAM, and wherein the redundant memory comprises SRAM.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a memory organized in a plurality of memory banks, wherein the plurality of memory banks comprises memory bit-cells, wherein the plurality of memory banks includes a first memory bank and a second memory bank, and wherein an individual memory bit-cell includes a non-volatile material which includes one of: a non-linear polar material, a magnet, or a resistive material; and
    a memory controller coupled to the memory, wherein the memory controller includes one or more circuitries configured to improve memory endurance of the memory via wear leveling, wherein the memory controller is to apply the wear leveling to the first memory bank and the second memory bank in a round-robin fashion, wherein the first memory bank has a first gap word, and wherein the second memory bank has a associated second gap word, wherein the memory controller is to request a write to an address of an individual memory bank or a read to an address of the individual memory bank of the first memory bank, and wherein the one or more circuitries are configured to swap the first gap word with an adjacent cache line or word in response to the request.

2. The apparatus of claim 1, wherein the first memory bank is next to the second memory bank.

3. The apparatus of claim 1, wherein the first gap word has a first gap pointer, wherein the one or more circuitries is to increment the first gap pointer after the swap.

4. The apparatus of claim 3, wherein the memory controller compares a number of read or write references or requests to the first memory bank with a first reference number, and swaps the first gap word with an adjacent cache line or word in response to the request if the number of read or write references or requests to the first memory bank is equal to the first reference number.

5. The apparatus of claim 4, wherein the memory controller compares a number of read or write references or requests to the first memory bank with the first reference number, and if the number of read or write references or requests to the first memory bank is not equal to the first reference number, the memory controller compares a number of read or write references or requests to the second memory bank with a second reference number.

6. The apparatus of claim 5, wherein the first reference number is equal to the second reference number.

7. The apparatus of claim 5, wherein the first reference number is different from the second reference number.

8. The apparatus of claim 5, wherein the memory controller compares a number of read or write references or requests to the second memory bank with a second reference number, and swaps the second gap word with an adjacent cache line or word in the second memory bank in response to the request if the number of read or write references or requests to the second memory bank is equal to the second reference number.

9. The apparatus of claim 8, wherein the memory controller increments a second gap pointer associated with the second gap word.

10. The apparatus of claim 9, wherein the memory controller resets the number of read or write references or requests to the first memory bank and the second memory bank.

11. The apparatus of claim 1, wherein the non-linear polar material includes one of: a ferroelectric material, a paraelectric material, or a non-linear dielectric.

12. The apparatus of claim 11, wherein the ferroelectric material includes one of:
    bismuth ferrite (BFO) with a first doping material, wherein the first doping material is one of Lanthanum or elements from lanthanide series of periodic table;
    lead zirconium titanate (PZT) or PZT with a second doping material, wherein the second doping material is one of La or Nb;
    a relaxor ferroelectric which includes one of: lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
    a perovskite which includes one of: $BaTiO_3$, $PbTiO_3$, $KNbO_3$, or $NaTaO_3$;
    a first hexagonal ferroelectric which includes one of: $YMnO_3$ or $LuFeO_3$;
    a second hexagonal ferroelectric of a type $h-RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
    hafnium (Hf), Zirconium (Zr), Aluminum (Al), Silicon (Si), their oxides or their alloyed oxides;
    hafnium oxides as $Hf_{1-x} E_x O_y$, where E can be Al, Ca, Ce, Dy, Er, Gd, Ge, La, Sc, Si, Sr, Sn, or Y, where x and y are first fractions;
    $Al(1-x)Sc(x)N$, $Ga(1-x)Sc(x)N$, $Al(1-x)Y(x)N$ or $Al(1-x)Mg(x)Nb(y)N$, wherein x and y are second fractions;
    $HfO_2$ doped with one of: Al, Ca, Ce, Dy, Er, Gd, Ge, La, Sc, Si, Sr, Sn, or Y;
    niobate type compounds $LiNbO_3$, $LiTaO_3$, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100, wherein the paraelectric material includes one of: SrTiO3, Ba(x)Sr(y)TiO3, HfZrO2, Hf—Si—O, La-substituted PbTiO3, or PMN-PT based relaxor ferroelectrics.

13. A method to improve memory endurance of a memory via wear leveling, the method comprising:
   requesting a read or write request to an address of a memory organized in a plurality of memory banks, wherein the plurality of memory banks comprises memory bit-cells, wherein the plurality of memory banks includes a first memory bank and a second memory bank, wherein the first memory bank is next to the second memory bank, and wherein an individual memory bit-cell includes a non-volatile material which includes one of: a non-linear polar material, a magnet, or a resistive material; and
   applying wear leveling to the first memory bank and the second memory bank in a round-robin fashion to improve memory endurance of the memory, wherein the first memory bank has a first gap word, wherein the first gap word has a first gap pointer, wherein the second memory bank has a second gap word, and wherein the second gap word has a second gap pointer, wherein the method comprising:
      swapping the first gap word with an adjacent cache line or word in response to requesting the read or write request.

14. The method of claim 13,
   incrementing the second gap pointer associated with the second gap word after swapping the first gap word;
   comparing a number of read or write references or requests to the first memory bank with a first reference number;
   swapping the first gap word with an adjacent cache line or word in response to requesting the read or write request if the number of read or write references or requests to the first memory bank is equal to the first reference number; and
   incrementing the first gap pointer associated with the first gap word.

15. The method of claim 14 comprising:
   comparing a number of read or write references or requests to the second memory bank with a second reference number if the number of read or write references or requests to the first memory bank is not equal to the first reference number;
   swapping the second gap word with an adjacent cache line or word in the second memory bank in response to the request if the number of read or write references or requests to the second memory bank is equal to the second reference number;
   incrementing the second gap pointer associated with the second gap word; and
   resetting the number of read or write references or requests to the first memory bank and the second memory bank.

16. A system comprising:
   a memory organized in a plurality of memory banks, wherein the plurality of memory banks comprises memory bit-cells, wherein the plurality of memory banks includes a first memory bank and a second memory bank, wherein an individual memory bit-cell includes a non-volatile material which includes one of: non-linear polar material, a magnet, or a resistive material, and wherein the memory stores one or more instructions;
   a processor circuitry coupled to the memory, wherein the processor circuitry executes the one or more instructions;
   a memory controller coupled to the memory, wherein the memory controller includes one or more circuitries configured to improve memory endurance of the memory via wear leveling, wherein the memory controller applies wear leveling to the first memory bank and the second memory bank in a round-robin fashion, wherein the first memory bank has a first gap word, and wherein the second memory bank has a second gap word, wherein the memory controller is to request a write to an address of an individual memory bank or a read to an address of the individual memory bank of the first memory bank, and wherein the one or more circuitries are configured to swap the first gap word with an adjacent cache line or word in response to the request by the memory controller; and
   a communication interface to allow the processor circuitry to communicate with another device.

17. The system of claim 16, wherein the first memory bank is next to the second memory bank, and wherein the memory controller:
   compares a number of read or write references or requests to the first memory bank with a first reference number;
   swaps the first gap word with an adjacent cache line or word in response to the request if the number of the number of read or write references or requests to the first memory bank is equal to the first reference number; and
   increments a gap pointer after the swap.

18. The system of claim 17, wherein the memory controller is configured to:
   compare a number of read or write references or requests to the second memory bank with a second reference number if the number of read or write references or requests to the first memory bank is not equal to the first reference number;
   swap the second gap word with an adjacent cache line or word in the second memory bank in response to the request if the number of read or write references or requests to the second memory bank is equal to the second reference number;
   increment the gap pointer associated with the second gap word; and
   reset the number of read or write references or requests to the first memory bank and the second memory bank.

* * * * *